United States Patent
Cheng et al.

(10) Patent No.: US 10,553,691 B2
(45) Date of Patent: Feb. 4, 2020

(54) FIELD EFFECT TRANSISTOR DEVICES HAVING GATE CONTACTS FORMED IN ACTIVE REGION OVERLAPPING SOURCE/DRAIN CONTACTS

(71) Applicant: International Business Machines Corporation, Armonk, NY (US)

(72) Inventors: Kangguo Cheng, Schenectady, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/240,570

(22) Filed: Jan. 4, 2019

(65) Prior Publication Data

US 2019/0157404 A1 May 23, 2019

Related U.S. Application Data

(62) Division of application No. 15/635,944, filed on Jun. 28, 2017, now Pat. No. 10,211,302.

(51) Int. Cl.
*H01L 21/768* (2006.01)
*H01L 21/3105* (2006.01)
(Continued)

(52) U.S. Cl.
CPC .. *H01L 29/41775* (2013.01); *H01L 21/31053* (2013.01); *H01L 21/76805* (2013.01);
(Continued)

(58) Field of Classification Search
CPC ......... H01L 21/76897; H01L 21/76895; H01L 21/76834; H01L 21/823475;
(Continued)

(56) References Cited

U.S. PATENT DOCUMENTS

| 5,043,778 A | 8/1991 | Teng et al. |
| 5,635,102 A | 6/1997 | Mehta |

(Continued)

OTHER PUBLICATIONS

List of IBM Patents or Patent Applications Treated as Related.

*Primary Examiner* — Zandra V Smith
*Assistant Examiner* — Jeremy J Joy
(74) *Attorney, Agent, or Firm* — Vazken Alexanian; Ryan, Mason & Lewis, LLP

(57) ABSTRACT

Semiconductor devices and methods are provided to fabricate FET devices having overlapping gate and source/drain contacts while preventing electrical shorts between the overlapping gate and source/drain contacts. For example, a semiconductor device includes a FET device, a vertical source/drain contact, a source/drain contact capping layer, and a vertical gate contact. The FET device includes a source/drain layer, and a gate structure. The vertical source/drain contact is formed in contact with a source/drain layer of the FET device. The source/drain contact capping layer is formed on an upper surface of the vertical source/drain contact. The vertical gate contact is formed in contact with a gate electrode layer of the gate structure. A portion of the vertical gate contact overlaps a portion of the vertical source/drain contact, wherein the source/drain contact capping layer electrically insulates the overlapping portions of the vertical gate and source/drain contacts.

20 Claims, 24 Drawing Sheets

(51) Int. Cl.
*H01L 21/8234* (2006.01)
*H01L 27/088* (2006.01)
*H01L 29/417* (2006.01)
*H01L 29/78* (2006.01)

(52) U.S. Cl.
CPC .. *H01L 21/76834* (2013.01); *H01L 21/76877* (2013.01); *H01L 21/76897* (2013.01); *H01L 21/823431* (2013.01); *H01L 21/823475* (2013.01); *H01L 29/41791* (2013.01); *H01L 29/785* (2013.01)

(58) Field of Classification Search
CPC ......... H01L 21/76831; H01L 21/76805; H01L 21/76677; H01L 29/41775; H01L 21/7685; H01L 21/76822; H01L 21/76816; H01L 21/823431; H01L 21/31053; H01L 29/7831; H01L 29/7827; H01L 29/66666; H01L 29/66606; H01L 29/78618; H01L 29/42372–4238; H01L 29/4966; H01L 29/41
See application file for complete search history.

(56) References Cited

U.S. PATENT DOCUMENTS

| | | | |
|---|---|---|---|
| 6,172,368 B1 | 1/2001 | Tarr et al. | |
| 6,849,193 B2 | 2/2005 | Hung et al. | |
| 7,709,333 B2 | 5/2010 | Zhu et al. | |
| 8,173,491 B2 | 5/2012 | Law et al. | |
| 8,226,840 B2 | 7/2012 | Sinha | |
| 8,263,467 B2 | 9/2012 | Grupp et al. | |
| 8,476,138 B2 | 7/2013 | Chakihara et al. | |
| 8,815,668 B2 | 8/2014 | Basker et al. | |
| 9,064,801 B1* | 6/2015 | Horak | H01L 21/283 |
| 9,202,751 B2 | 12/2015 | Wei et al. | |
| 9,224,840 B2 | 12/2015 | Flachowsky et al. | |
| 9,287,362 B1 | 3/2016 | Basu et al. | |
| 9,312,354 B2 | 4/2016 | Liu et al. | |
| 9,337,094 B1 | 5/2016 | Pranatharthiharan et al. | |
| 9,412,656 B2 | 8/2016 | Fu et al. | |
| 9,508,818 B1* | 11/2016 | Basker | H01L 29/665 |
| 9,825,031 B1* | 11/2017 | Bouche | H01L 27/0886 |
| 9,985,023 B1* | 5/2018 | Liu | H01L 23/485 |
| 2004/0043550 A1 | 3/2004 | Chakihara et al. | |
| 2006/0084232 A1 | 4/2006 | Grupp et al. | |
| 2011/0061810 A1 | 3/2011 | Ganguly et al. | |
| 2012/0139062 A1* | 6/2012 | Yuan | H01L 21/76897 257/411 |
| 2013/0175583 A1* | 7/2013 | Yuan | H01L 23/485 257/288 |
| 2014/0077305 A1* | 3/2014 | Pethe | H01L 21/76895 257/368 |
| 2014/0308618 A1 | 10/2014 | Wang et al. | |
| 2014/0339629 A1* | 11/2014 | Xie | H01L 29/7827 257/330 |
| 2015/0145065 A1 | 5/2015 | Kanakasabapathy et al. | |
| 2015/0178945 A1 | 7/2015 | Kamineni et al. | |
| 2015/0187945 A1* | 7/2015 | Kamineni | H01L 29/785 257/384 |
| 2015/0311082 A1* | 10/2015 | Bouche | H01L 29/41775 257/288 |
| 2015/0357409 A1* | 12/2015 | Horak | H01L 21/28008 257/407 |
| 2016/0049481 A1* | 2/2016 | Wei | H01L 21/823878 257/401 |
| 2016/0064514 A1* | 3/2016 | Bouche | H01L 29/66545 257/401 |
| 2016/0336183 A1* | 11/2016 | Yuan | H01L 29/66795 |

* cited by examiner

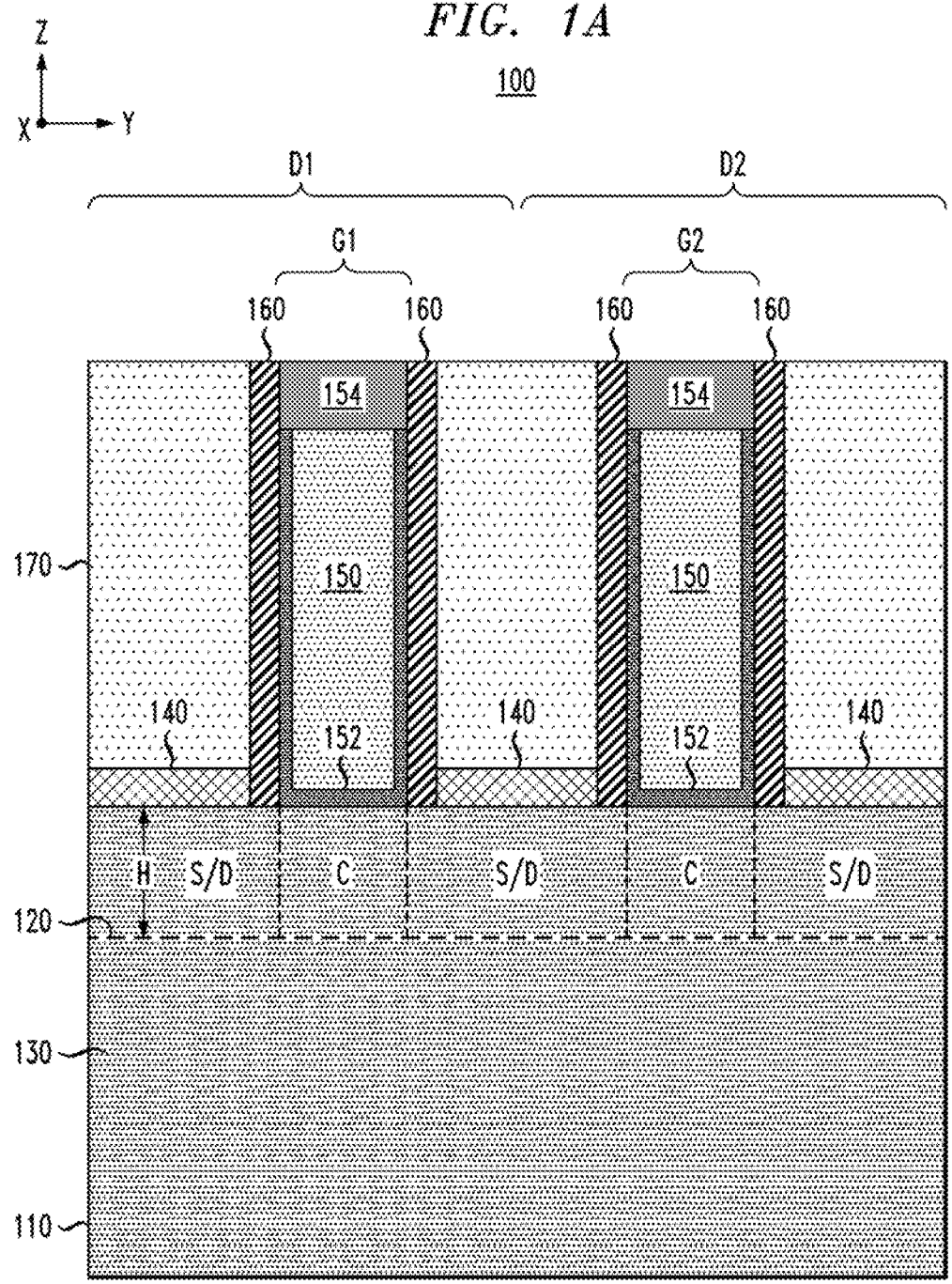

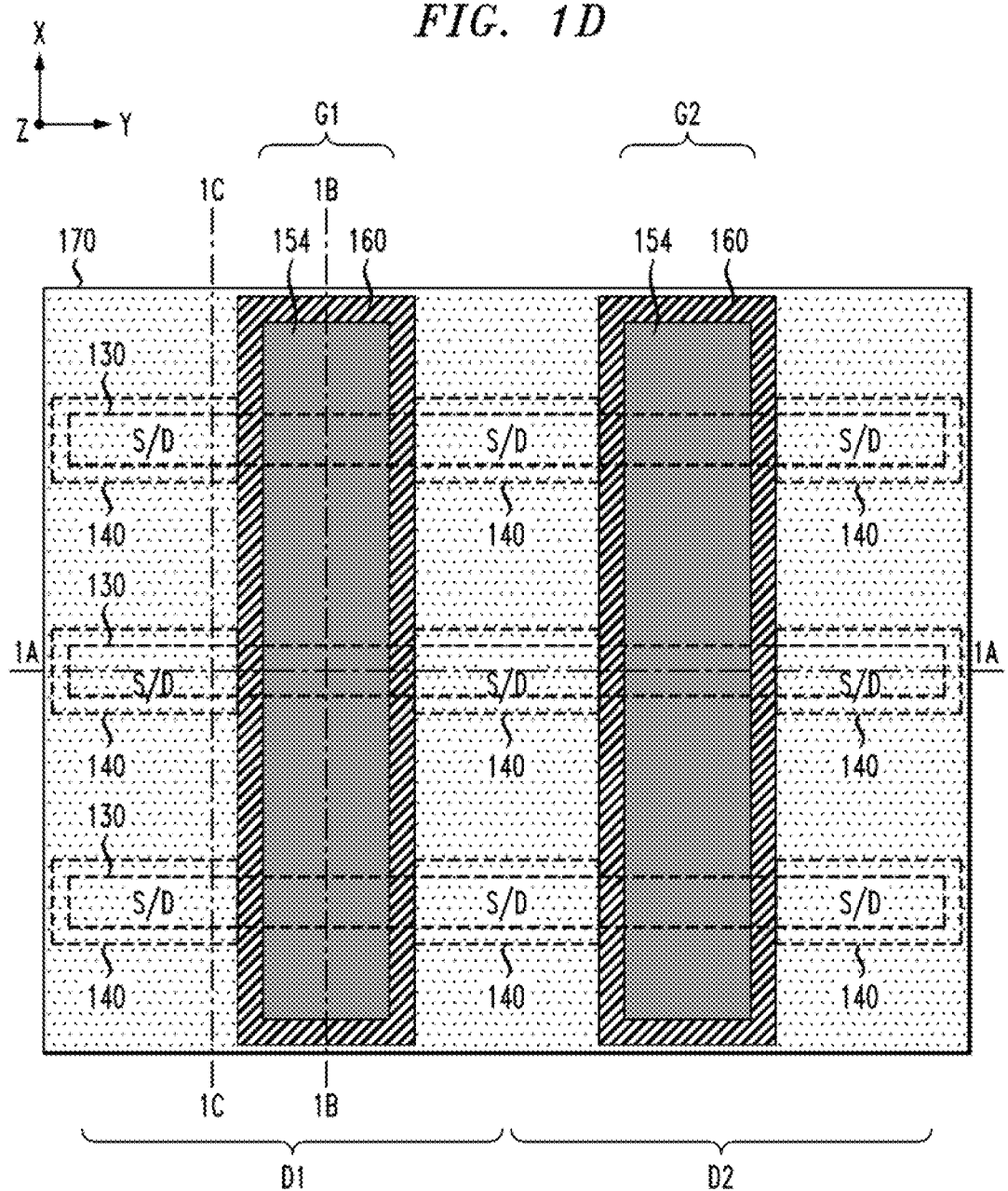

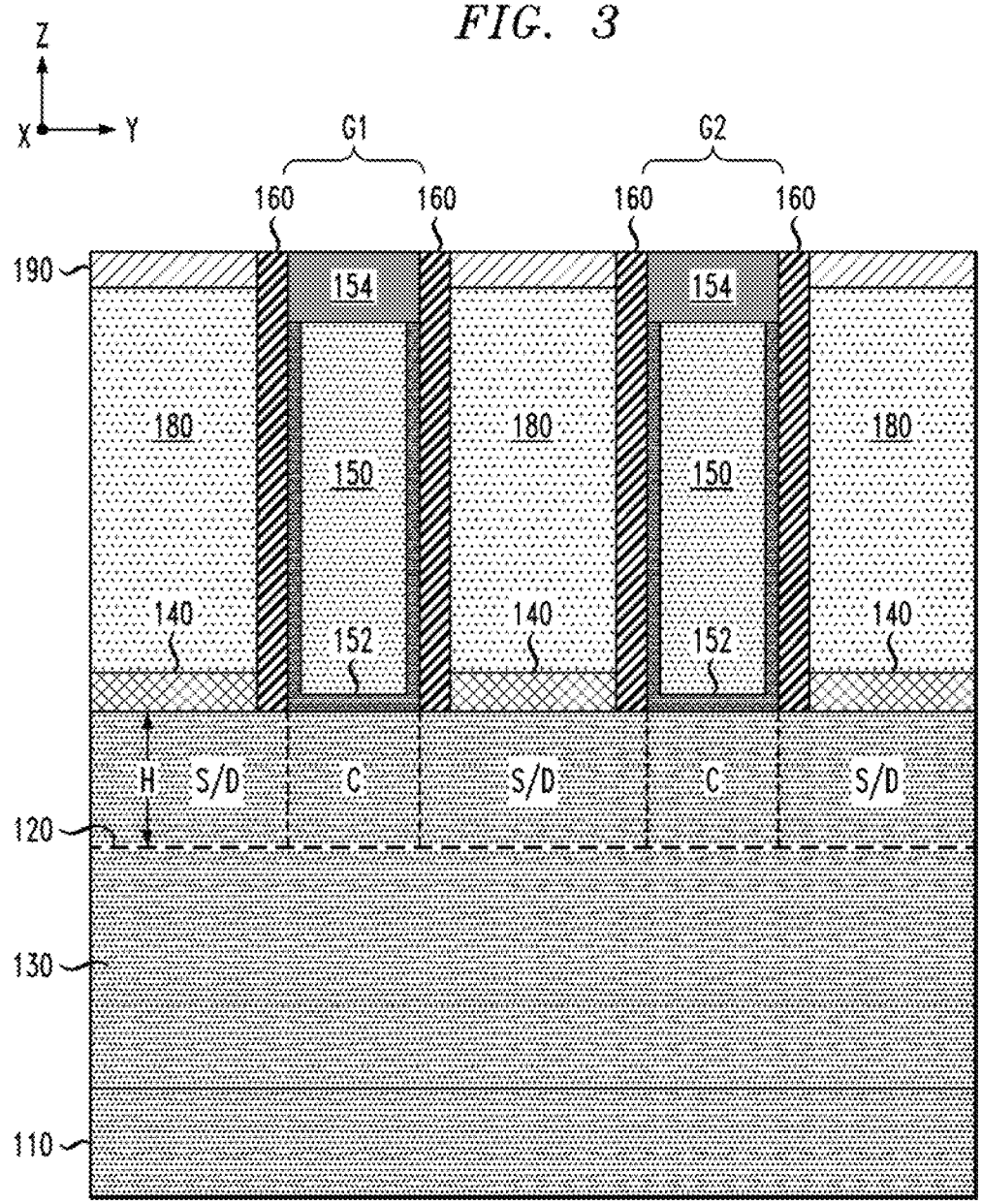

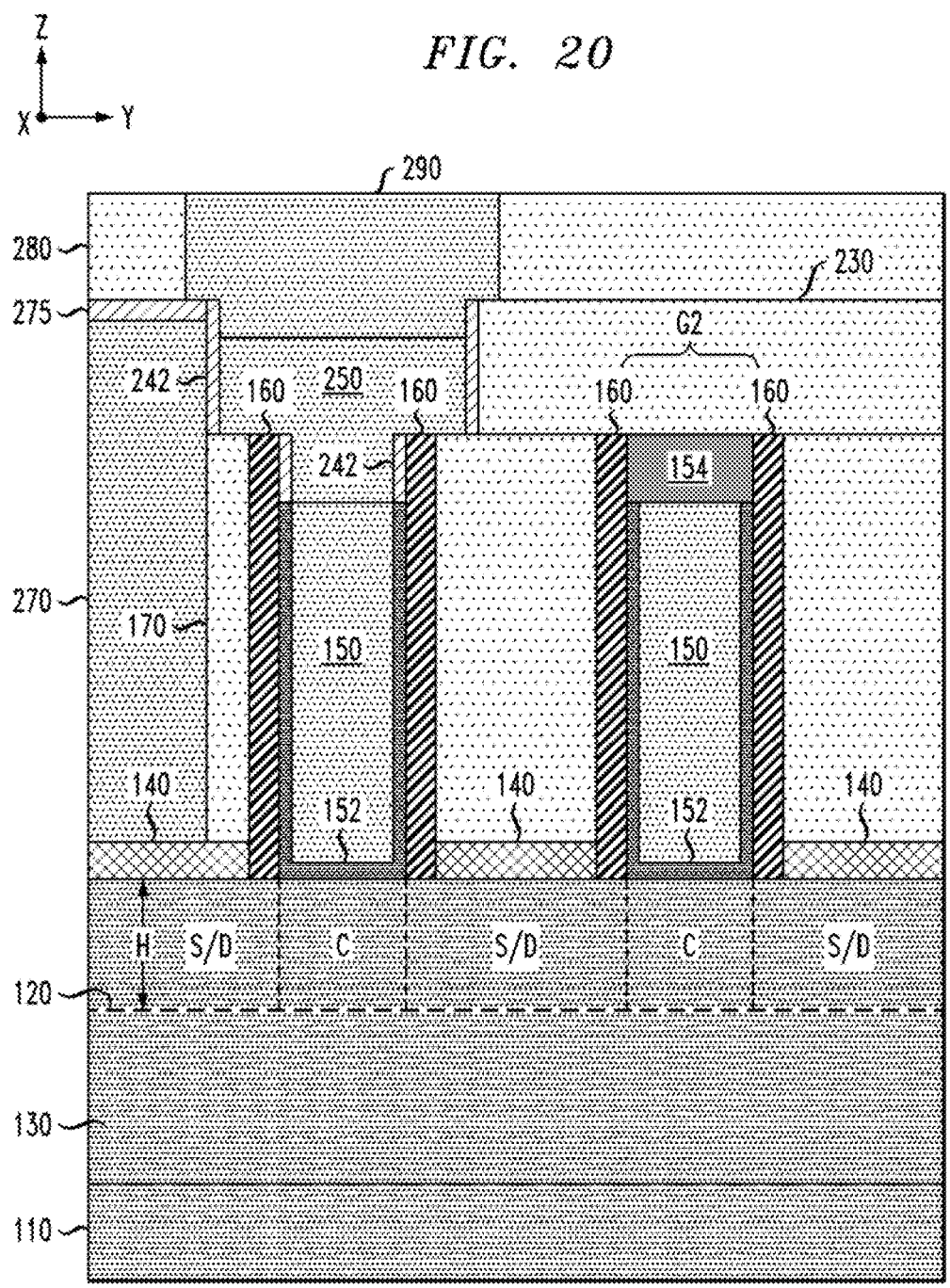

FIELD EFFECT TRANSISTOR DEVICES HAVING GATE CONTACTS FORMED IN ACTIVE REGION OVERLAPPING SOURCE/DRAIN CONTACTS

TECHNICAL FIELD

This disclosure generally relates to semiconductor fabrication techniques and, in particular, techniques for fabricating FET (field effect transistor) devices.

BACKGROUND

As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective CMOS scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin which extend from both sides of the gate structure. The portion of the vertical semiconductor fin that is covered by the gate structure between the source/drain regions comprises a channel region of the FinFET device. With FinFET and other types of FET devices, scaling is determined, in party, by how closely conductive source/drain and gate contacts can be formed in proximity to each other for a given layout without resulting in electrical shorts.

SUMMARY

Embodiments of the invention include FET devices having gate contacts formed in active regions overlapping source/drain contacts, as well as methods for fabricating FET devices with gate contacts formed in active regions overlapping source/drain contacts while preventing electrical shorts between overlapping portions of the gate and source/drain contacts.

For example, one embodiment includes a semiconductor device which comprises a FET device, a vertical source/drain contact, a source/drain contact capping layer, and a vertical gate contact. The FET device is formed on a semiconductor substrate, wherein the FET device comprises a source/drain layer, and a gate structure comprising a gate electrode layer, a gate capping layer, and a gate sidewall spacer. The vertical source/drain contact is formed in contact with the source/drain layer of the FET device. The source/drain contact capping layer is formed on an upper surface of the vertical source/drain contact. The vertical gate contact is formed in contact with the gate electrode layer of the gate structure of the FET device. A portion of the vertical gate contact overlaps a portion of the vertical source/drain contact, wherein the source/drain contact capping layer electrically insulates the overlapping portions of the vertical gate contact and the vertical source/drain contact.

Another embodiment includes a method for fabricating a semiconductor device, comprising:

forming a FET device on a semiconductor substrate, the FET device comprising a source/drain layer, and a gate structure comprising a gate electrode layer, a gate capping layer, and a gate sidewall spacer;

forming a first interlevel dielectric (ILD) layer;

forming a vertical source/drain contact in the first ILD layer in contact with the source/drain layer of the FET device;

forming a source/drain contact capping layer on an upper surface of the vertical source/drain contact;

forming a second ILD layer which comprises a gate contact opening, wherein the gate contact opening exposes a portion of the gate structure and a portion of the source/drain contact capping layer; and forming a vertical gate contact in the gate contact opening of the second ILD layer, wherein a portion of the vertical gate contact overlaps a portion of the vertical source/drain contact, and wherein the source/drain contact capping layer electrically insulates the overlapping portions of the vertical gate contact and the vertical source/drain contact.

Another embodiment includes a method for fabricating a semiconductor device, comprising:

forming a FET device on a semiconductor substrate, the FET device comprising a source/drain layer, and a gate structure comprising a gate electrode layer, a gate capping layer, and a gate sidewall spacer;

forming a first ILD layer which encapsulates the FET device;

forming a gate contact opening in the first ILD layer and the gate capping layer to expose a portion of the gate electrode layer of the gate structure, wherein a portion of the gate contact opening has width that is greater than a width of the gate structure;

forming an insulating spacer on vertical sidewalls of the gate contact opening in the first ILD layer;

forming a vertical gate contact in the gate contact opening in contact with the exposed portion of the gate electrode layer of the gate structure of the FET device;

forming a source/drain contact opening in the first ILD layer down to the source/drain layer of the FET device, wherein the source/drain contact opening exposes a portion of the insulating spacer formed on the vertical sidewalls of the gate contact opening; and forming a vertical source/drain contact in the source/drain contact opening in contact with the source/drain layer, wherein the exposed portion of the insulating spacer serves to electrically insulate the vertical gate contact from the vertical source/drain contact.

Other embodiments will be described in the following detailed description of embodiments, which is to be read in conjunction with the accompanying figures.

BRIEF DESCRIPTION OF THE DRAWINGS

FIGS. 1A through 10 schematically illustrate a process for fabricating FinFET devices with gate contacts formed in active regions overlapping source/drain contacts, according to an embodiment of the invention, wherein:

FIGS. 1A, 1B, 1C, and 1D are schematic views of a semiconductor device at an intermediate stage of fabrication in which FinFET devices with metal gate structures are formed on a semiconductor substrate;

FIG. 3 is a schematic view of the semiconductor device of FIG. 2A after recessing the vertical source/drain contacts and forming source/drain contact capping layers on the recessed surfaces of the vertical source/drain contacts;

FIG. 4 is a schematic view of the semiconductor device of FIG. 3 after forming a second ILD layer on a planarized surface of the semiconductor device, and forming a gate contact etch mask on the second ILD layer;

FIG. 5 is a schematic view of the semiconductor device of FIG. 4 after patterning the second ILD layer using the gate contact etch mask and removing an exposed portion of a gate capping layer to expose a metal gate electrode layer of a metal gate structure;

FIG. 6 is a schematic view of the semiconductor device of FIG. 5 after forming a vertical gate contact in an opening of the second ILD layer in contact with the metal gate electrode layer of the metal gate structure;

FIG. 7 is a schematic view of the semiconductor device of FIG. 6 after forming a source/drain contact etch mask on the second ILD layer;

FIG. 8 is a schematic view of the semiconductor device of FIG. 7 after patterning the second ILD layer and a source/drain contact capping layer using the source/drain contact etch mask to expose a portion of a vertical source/drain contact;

FIG. 9 is a schematic view of the semiconductor device of FIG. 8 after forming a source/drain via contact in the patterned second ILD layer in contact with the exposed portion of the vertical source/drain contact; and FIG. 10 is a top plan schematic view of the semiconductor device of FIG. 9 showing a layout of the gate and source/drain contacts, wherein the vertical gate contact is formed in the active region overlapping portions of two vertical source/drain contacts.

FIGS. 11 through 20 schematically illustrate a process for fabricating FinFET devices with gate contacts formed in active regions overlapping source/drain contacts, according to another embodiment of the invention, wherein:

FIG. 11 is a schematic view of a semiconductor device at an intermediate stage of fabrication in which FinFET devices with metal gate structures are formed on a semiconductor substrate and encapsulated in an ILD layer;

FIG. 12 is a schematic view of the semiconductor device of FIG. 11 after forming a gate contact etch mask, patterning the ILD layer using the gate contact etch mask, and removing an exposed portion of a gate capping layer to expose a metal gate electrode layer of a metal gate structure;

FIG. 13 is a schematic view of the semiconductor device of FIG. 12 after removing the gate contact etch mask, and forming a conformal capping layer over the surface of the semiconductor device;

FIG. 14 is a schematic view of the semiconductor device of FIG. 13 after patterning the conformal capping layer to form insulating spacers on vertical sidewalls of a gate contact opening formed in the ILD layer;

FIG. 15 is a schematic view of the semiconductor device of FIG. 14 after forming a vertical gate contact and a gate contact capping layer in the gate contact opening of the ILD layer;

FIG. 16 is a schematic view of the semiconductor device of FIG. 15 after forming a source/drain contact mask on the ILD layer, and patterning the ILD layer using the source/drain contact mask to form a source/drain contact opening through the ILD layer down to a source/drain layer;

FIG. 17 is a schematic view of the semiconductor device of FIG. 16 after forming a vertical source/drain contact in the patterned ILD layer in contact with an underlying source/drain contact of a FinFET device;

FIG. 18 is a schematic view of the semiconductor device of FIG. 17 after recessing the vertical source/drain contact and forming a source/drain contact capping layer on the recessed surface of the vertical source/drain contact;

FIG. 19 is a schematic view of the semiconductor device of FIG. 18 after depositing and patterning an ILD layer to form an opening that exposes a portion of the gate contact capping layer formed on the vertical gate contact; and FIG. 20 is a schematic view of the semiconductor device of FIG. 19 after removing the exposed portion of the gate contact capping layer to expose a portion of the vertical gate contact, and forming a gate via contact to the vertical gate contact.

DETAILED DESCRIPTION

Figure 1B:
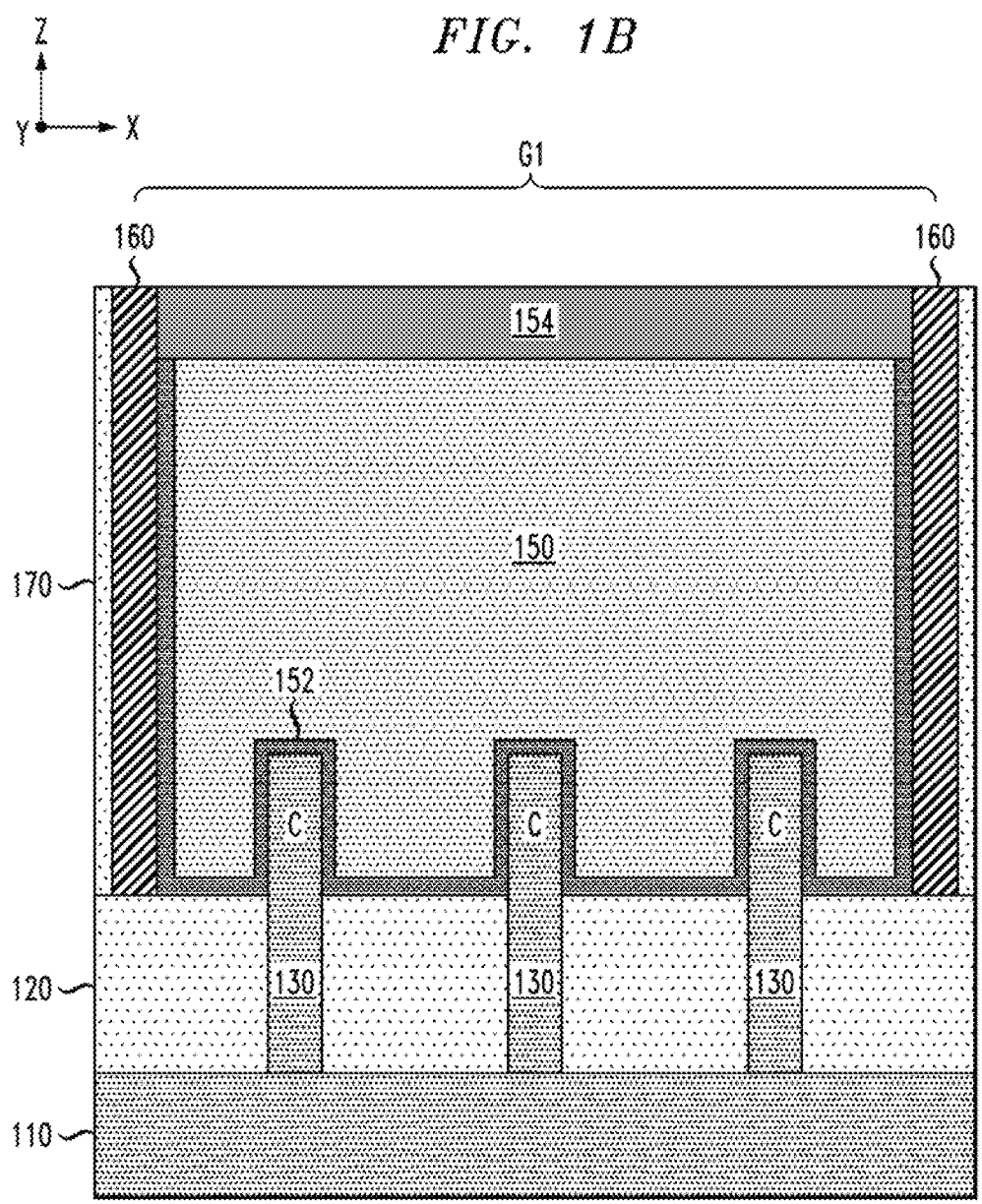

Embodiments of the invention will now be discussed in further detail with regard to FET devices having gate contacts formed in active regions overlapping source/drain contacts, as well as methods for fabricating FET devices with gate contacts formed in active regions overlapping source/drain contacts while preventing electrical shorts between overlapping portions of the gate and source/drain contacts. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

FIGS. 1A through 10 schematically illustrate a process for fabricating FinFET devices with gate contacts formed in active regions overlapping source/drain contacts, according to an embodiment of the invention. To begin, FIGS. 1A, 1B, 1C, and 1D are schematic views of a semiconductor device 100 at an intermediate stage of fabrication in which FinFET devices D1 and D2 with respective metal gate structures G1 and G2 are formed on a semiconductor substrate. FIG. 1D is a schematic top plan view (X-Y plane) of the semiconductor device 100, while FIGS. 1A, 1B and 1C are cross-sectional side views of the semiconductor device 100 along planes that are represented by respective lines shown in FIG. 1D. In particular, FIG. 1A is a cross-sectional side view (Y-Z plane) of the semiconductor device 100 along line 1A-1A in FIG. 1D. FIG. 1B is a cross-sectional side view (X-Z plane) of the semiconductor device 100 along line 1B-1B in FIG. 1D, and FIG. 1C is a cross-sectional side view (X-Z plane) of the semiconductor device 100 along line 1C-1C in FIG. 1D.

As shown in FIGS. 1A, 1B, 1C and 1D, the semiconductor device 100 comprises a semiconductor substrate 110, an isolation layer 120, a plurality of vertical semiconductor fins 130, source/drain (S/D) layers 140, metal gate structures G1 and G2, and a first ILD layer 170 (or pre-metal deposition (PMD) layer). The metal gate structure G1 and G2 each comprise a gate electrode layer 150 and a gate dielectric layer 152, which are formed over respective channel (C) regions of the vertical semiconductor fins 130. In one embodiment, the metal gate structures G1 and G2 are formed using a replacement metal gate (RMG) in which dummy gate structures are initially formed and then replaced with the metal gate structures G1 and G2 using known methods. The metal gate structures G1 and G2 are encapsulated in dielectric material including gate capping layers 154 (formed of silicon nitride (SiN), for example) and gate sidewall spacers 160 (formed of silicon boron carbon nitride (SiBCN), for example).

Figure 1C:
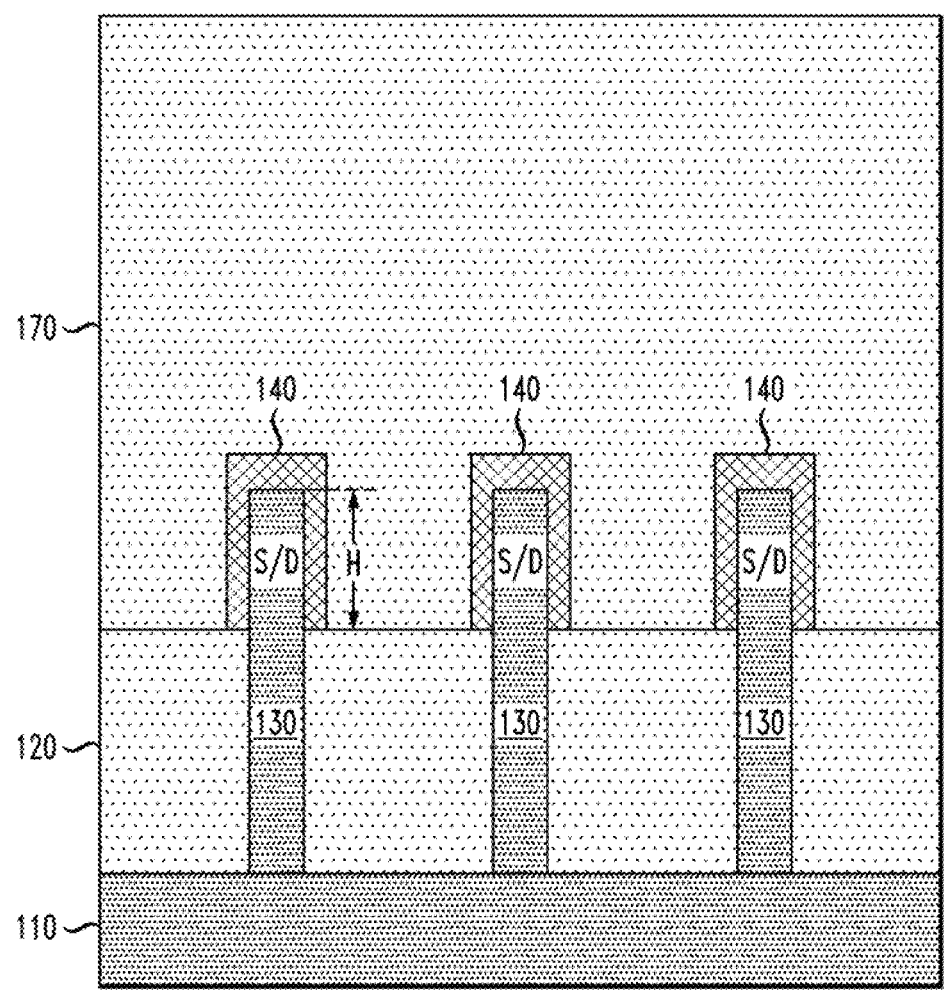

As shown in FIGS. 1A, 1C and 1D, for example, portions of the vertical semiconductor fins 130 which extend from the sides of the metal gate structures G1 and G2 serve as source/drain (S/D) regions for FinFET devices D1 and D2. As illustrated in the example embodiment of FIGS. 1B and 1D, each FinFET device D1 and D2 comprises a common gate structure that is formed over a portion of three vertical semiconductor fins 130. In this regard, each FinFET device D1 and D2 may be configured as a multi-fin FinFET structure when the respective source/drain regions on each side of the gate structure are commonly connected to a respective single vertical source/drain contact (i.e., three FinFET segments connected in parallel to form a multi-fin FinFET device). Further, in the example shown in FIG. 1D, the FinFET devices D1 and D2 share a common source/drain (S/D) region between the metal gate structures G1 and G2, such that the FinFET devices D1 and D2 are connected in series.

The semiconductor device 100 shown in FIGS. 1A, 1B, 1C and 1D can be fabricated using known semiconductor fabrication techniques and suitable semiconductor materials. For example, the semiconductor substrate 110 is illustrated as a generic substrate layer, and may comprise various structures and layers of semiconductor material. In one embodiment, the semiconductor substrate 110 comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy, silicon carbide (SiC), silicon-germanium carbide alloy, or compound semiconductor materials (e.g. III-V or II-VI, etc.). Non-limiting examples of III-V compound semiconductor materials include gallium arsenide, indium arsenide, and indium phosphide. In another embodiment, the semiconductor substrate 110 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

The isolation layer 120 and vertical semiconductor fins 130 can be fabricated using various methods. For example, for bulk and SOI substrate embodiments, the vertical semiconductor fins 130 can be formed by patterning an active silicon layer (e.g., crystalline silicon, crystalline SiGe, III-V compound semiconductor material, etc.) at the surface of a bulk semiconductor substrate or the SOI substrate to form a pattern of vertical semiconductor fins in different device regions across the semiconductor wafer, three of which are shown in FIGS. 1B, 1C and 1D for ease of illustration. In one embodiment, the vertical semiconductor fins 130 may be patterned from a crystalline SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

After forming the vertical semiconductor fins 130, a layer of insulating material can be deposited to cover the vertical semiconductor fins 130, and then planarized (via chemical-mechanical planarization (CMP)) down to the top of the vertical semiconductor fins 130, and then further recessed using an etch-back process (e.g., selective Reactive Ion Etch (RIE) process) to form the isolation layer 120. As shown in FIG. 1C, the layer of insulating material is etched down to a target level to expose upper portions of the vertical semiconductor fin structures 130, which defines a baseline active fin height H for the FinFET devices D1 and D2. For illustrative purposes, an upper surface of the isolation layer 120 is shown in phantom in FIG. 1A as a dashed line, further showing the baseline active fin height H. In one embodiment of the invention, the isolation layer 120 can be selectively etched using RIE, although other etching processes may be employed. A timed etch can be performed to remove a desired amount of insulating material to expose the upper portions of the vertical semiconductor fin structures 130.

In another embodiment, the vertical semiconductor fins 130 can be formed using a process in which the isolation layer 120 is first deposited and then etched using RIE or deep RIE to form a pattern of trenches in the isolation layer 120 down to the semiconductor substrate 110, which corresponds to a pattern of vertical semiconductor fins to be formed. The vertical semiconductor fins 130 are then formed by epitaxially growing crystalline semiconductor material, starting on the exposed surfaces of the semiconductor substrate 110 at the bottom of the trenches, using ART (aspect ratio trapping) techniques. ART enables selective epitaxial growth of crystalline Si, SiGe, or III-V compound semiconductor material, for example, to fill high aspect ratio trenches formed in an insulating layer, and thereby form high quality active channel layers for FinFET devices. The crystalline SiGe layer (or other types of epitaxial semiconductor layers) can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

Next, dummy gate structures are fabricated using known process flows (e.g., by sequentially forming a dummy oxide layer and polysilicon layer over the substrate and patterning the layers to form dummy gate structures). The gate sidewall spacers 160 are then formed by depositing and patterning one or more layers of dielectric material such as SiN, SiBCN, or other low-k dielectric materials which are suitable for use as gate insulating spacers for gate structures of FinFET devices. The one or more layers of dielectric material can be deposited using plasma-enhanced chemical vapor deposition (PECVD), atomic layer deposition (ALD), or other suitable deposition methods which enable the deposition of thin films of dielectric material with high conformality.

After forming the gate sidewall spacers 160, the process flow continues with forming the S/D layers 140 on the exposed S/D regions of the vertical semiconductor fins 130. In one embodiment of the invention, the S/D layers 140 are formed by growing epitaxial semiconductor material on the exposed surfaces of the S/D regions of the vertical semiconductor fins 130 adjacent to the dummy gate structures. The type of epitaxial material and doping used to form the S/D layers 140 will vary depending on whether the FinFET devices D1 and D2 are P-type or N-type devices. Although not specifically shown in FIG. 1D, the source/drain layers 140 can be epitaxially grown so that adjacent source/drain layers 140 formed on adjacent S/D regions of the vertical semiconductor fins 130 can merge to collectively form a single source/drain layer. In another embodiment, the source/drain layers 140 may be silicide layers that are formed on the exposed surfaces of the S/D regions of the vertical semiconductor fins 130 using known methods.

Following formation of the S/D layers 140, the process flow continues with depositing and planarizing a layer of dielectric material to form the ILD layer 170. The ILD layer 170 is formed, for example, by depositing one or more layers of insulating material over the surface of the semiconductor substrate to cover the dummy gate structures, and then planarizing the surface of the semiconductor substrate down to a level which exposes the upper surface of a hard mask layer (or capping layer) formed on the dummy gate structures. The ILD layer 170 can be formed using suitable dielectric materials including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the ILD layer 170 may comprise a single deposited layer of insulating material, or multiple layers of insulating material (e.g., a first layer of a flowable oxide and a second layer of insulating material formed on the first layer). The ILD layer 170 may be deposited using known deposition techniques, such as, for example, ALD, PECVD, PVD (physical vapor deposition), or spin-on deposition.

Following formation of the ILD layer 170, the process flow continues with a RMG process to remove the sacrificial material (e.g., dummy gate oxide and dummy gate poly layers) of the dummy gate structures, and then form the metallic gate structures G1 and G2 in place of the dummy gate structures using known process flows. In one embodiment, the metal gate structures G1 and G2 are formed by depositing one or more conformal layers of gate dielectric material over the surface of the semiconductor structure, and depositing one or more layers of conductive material over the gate dielectric material. A planarization process (e.g., CMP) is then performed to polish the surface of the semiconductor structure down to the ILD layer 170, thereby removing the overburden portions of the gate dielectric and conductive materials, and forming the gate electrode layers 150 and gate dielectric layers 152 of the metal gate structures G1 and G2.

The gate dielectric layers 152 are formed with any suitable dielectric material including, for example, nitride, oxynitride, or oxide or a high-k dielectric material having a dielectric constant of about 3.9 or greater. In particular, the gate dielectric material 152 can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The gate dielectric material 152 is deposited using known methods such as ALD, which allows for high conformality of the gate dielectric material.

The gate electrode layers 150 are formed with any suitable conductive material including, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

In another embodiment, a thin conformal layer of work function metal (WFM) may be deposited over the conformal gate dielectric layer 152 prior to forming the gate electrode layer 150. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material that forms the gate electrode layers 150 can serve as a WFM layer.

Following the formation of the metal gate structures G1 and G1, the gate capping layers 154 can be fabricated by a process which generally comprises recessing the metal gate material to a target level below the planarized surface of the substrate, depositing a layer of dielectric material (e.g., SiN) to fill the recessed region above the gate electrode layers 150, and then planarizing the surface of the semiconductor structure down to an upper surface of the first ILD layer 170 to remove the overburden dielectric material and form the gate capping layers 154, resulting in the semiconductor structure 100 shown in FIGS. 1A, 1B, 1C, and 1D. The process flow then continues with MOL (middle of the line) processing to form vertical contacts using a process flow as schematically illustrated in FIGS. 2A through 10.

Figure 2A:
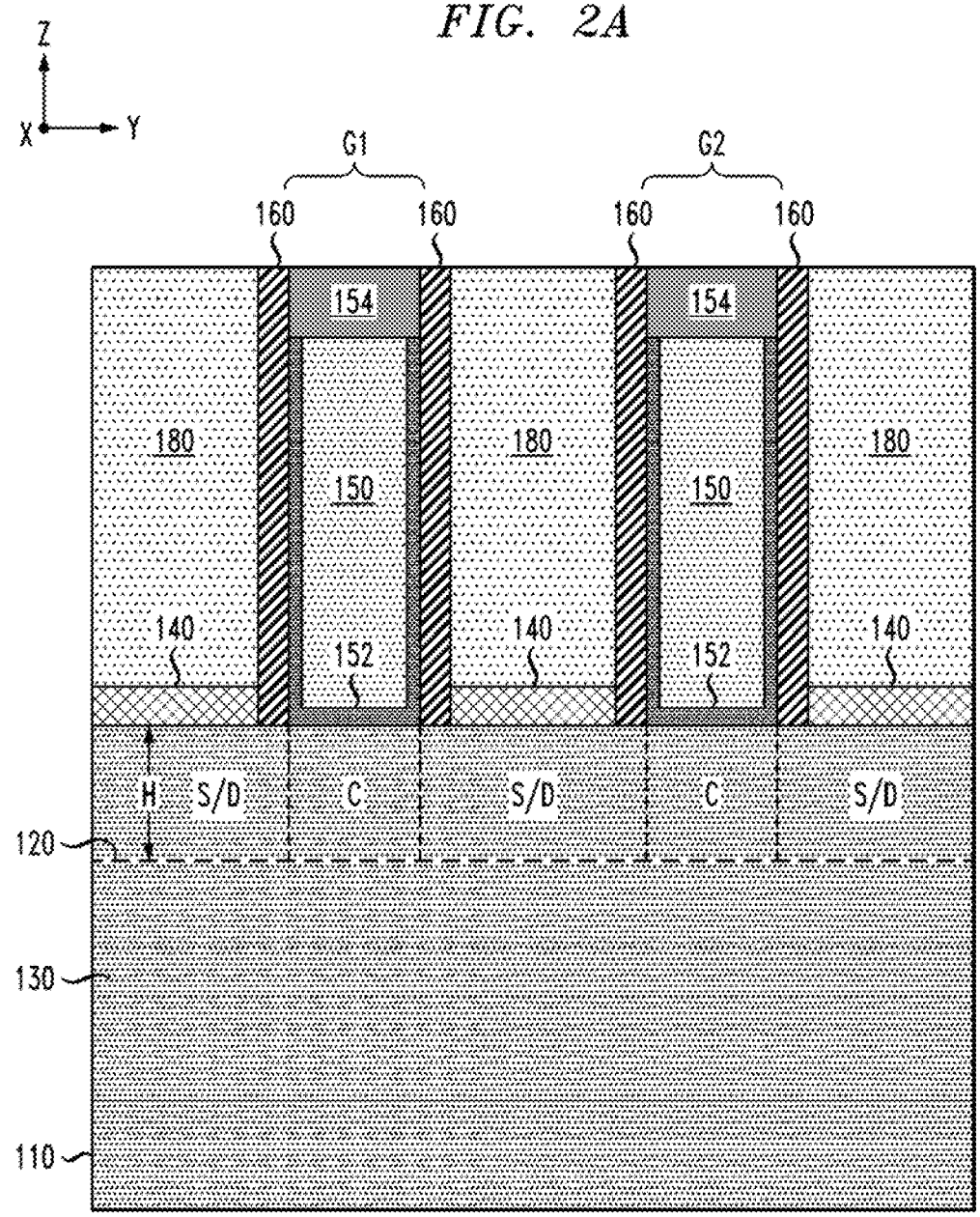
FIGS. 2A and 2B are schematic views of the semiconductor device of FIGS. 1A and 1D, respectively, after forming vertical source/drain contacts within a first ILD layer in contact with source/drain layers of the FinFET devices.
Figure 2B:
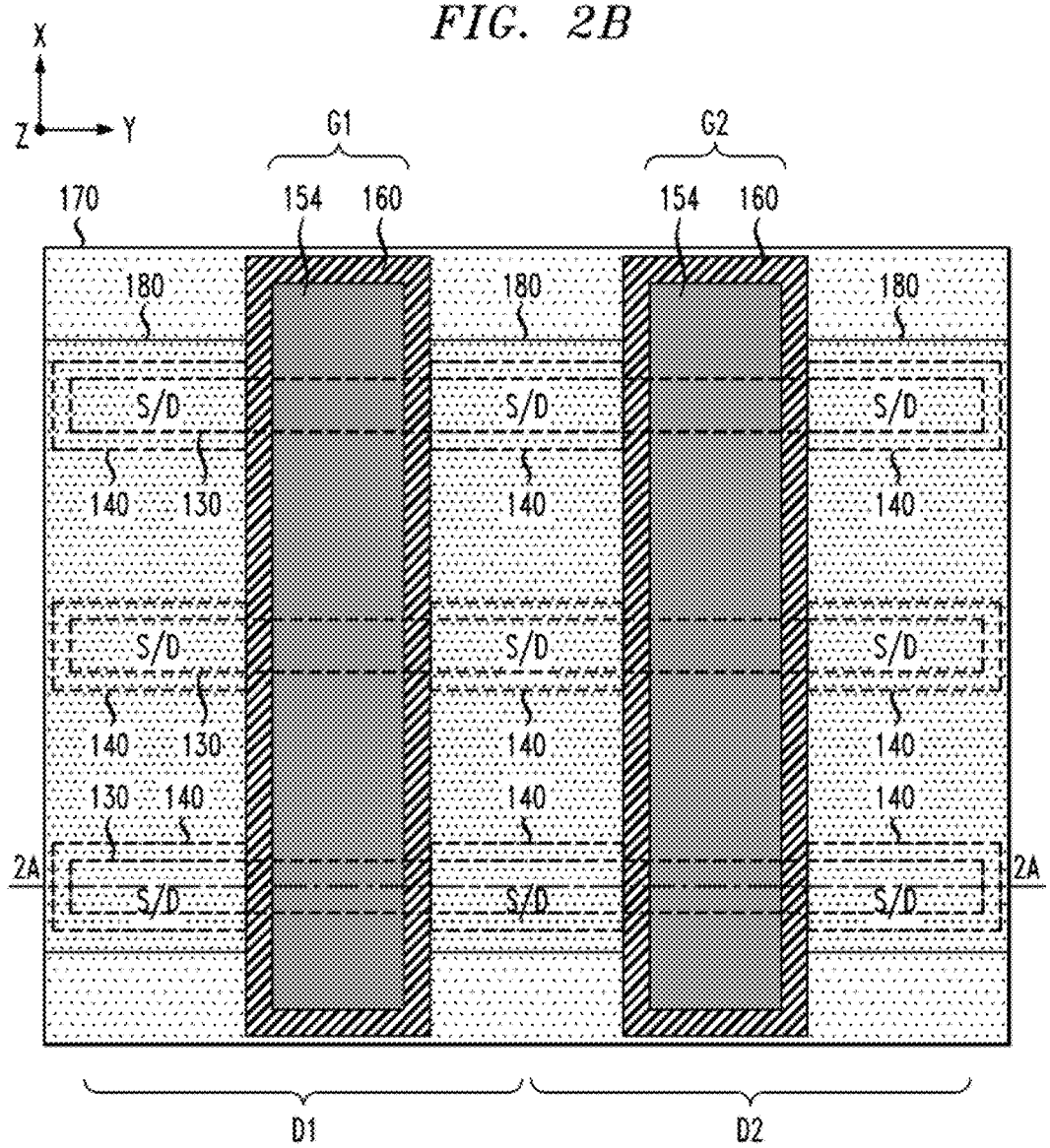

To begin, FIGS. 2A and 2B are schematic views of the semiconductor device of FIGS. 1A and 1D, respectively, after forming vertical source/drain contacts 180 within the first ILD layer 170 in contact with the source/drain layers 140 of the FinFET devices D1 and D2. FIG. 2B is a schematic top plan view (X-Y plane) of the semiconductor device 100 after forming the vertical source/drain contacts 180, and FIG. 2A is a cross-sectional side view (Y-Z plane) of the semiconductor device 100 along line 2A-2A in FIG. 2B. As shown in FIG. 2B, each vertical source/drain contact 180 is formed to contact three adjacent source/drain layers 140 on one side of the metal gate structures G1 and G2. The vertical source/drain contacts 180 can be formed using a process flow as follows.

An etch mask (or source/drain contact mask) can be photolithographically formed on the planarized surface of the semiconductor structure shown in FIGS. 1A, 1B, 1D, and 1C, wherein the etch mask comprises an image of the vertical source/drain contacts 180 to be formed. The ILD layer 170 is then patterned using the etch mask to form openings through the ILD layer 170 down to the source/drain layers 140. The openings can be formed down to a level that exposes at least upper regions of the source/drain layers 140, or down to an upper surface of the isolation layer 120 (depending on the desired amount of contact area between the source/drain layers 140 and bottom regions of the vertical source/drain contacts 180). A layer of metallic material, such as tungsten, is then deposited to fill the openings with metallic material, followed by a planarization process (e.g., CMP) to planarize the surface of the semiconductor structure down to the gate capping layers 154 and remove the overburden metallic material, resulting in the semiconductor structure shown in FIGS. 2A and 2B with the vertical source/drain contacts 180.

While the example embodiment shows a vertical source/drain contact 180 being formed between the metal gate structures G1 and G1 for illustrative purposes, it is to be understood that the layout of the vertical source/drain contacts 180 will vary depending on the circuit configuration. For example, in one embodiment, the FinFET devices D1 and D2 can be connected in series with a common source/drain region between the metal gate structures G1 and G2 as shown in FIG. 1A, but where no vertical source/drain contact 180 is formed between the metal gate structures G1 and G2.

Next, FIG. 3 is a schematic view of the semiconductor device of FIG. 2A after recessing an upper surface of the vertical source/drain contacts 180 and forming capping layers 190 (or source/drain contact capping layers) on the recessed surfaces of the vertical source/drain contacts 180. For example, in one embodiment of the invention, the vertical source/drain contacts 180 can be recessed down to a target level below the planarized surface of the semiconductor structure using an etch process and etch environment which is suitable to etch the metallic material (e.g., tungsten) of the vertical source/drain contacts 180 selective to the dielectric materials of the ILD layer 170, the gate capping layer 154 and the gate sidewall spacers 160. Following the recess process, a layer of insulating material is deposited to fill the recessed regions above the vertical source/drain contacts 180, and then planarized down to the gate capping layers 154 to remove the overburden insulating material, resulting in the semiconductor structure shown in FIG. 3 with the source/drain contact capping layers 190 formed on the recessed surfaces of the vertical source/drain contacts 180.

In one embodiment, the source/drain contact capping layers 190 are formed of an insulating/dielectric material that has etch selectivity with respect to the dielectric materials that are used to form the gate capping layers 154 and the gate sidewall spacers 160. For example, in one embodiment of the invention, the source/drain contact capping layers 190 are formed of a silicon oxycarbide (SiCO) material, which can be etched selective to the dielectric materials (e.g., SiN or SiBCN) of the gate capping layers 154 and the gate sidewall spacers 160.

Figure 4:
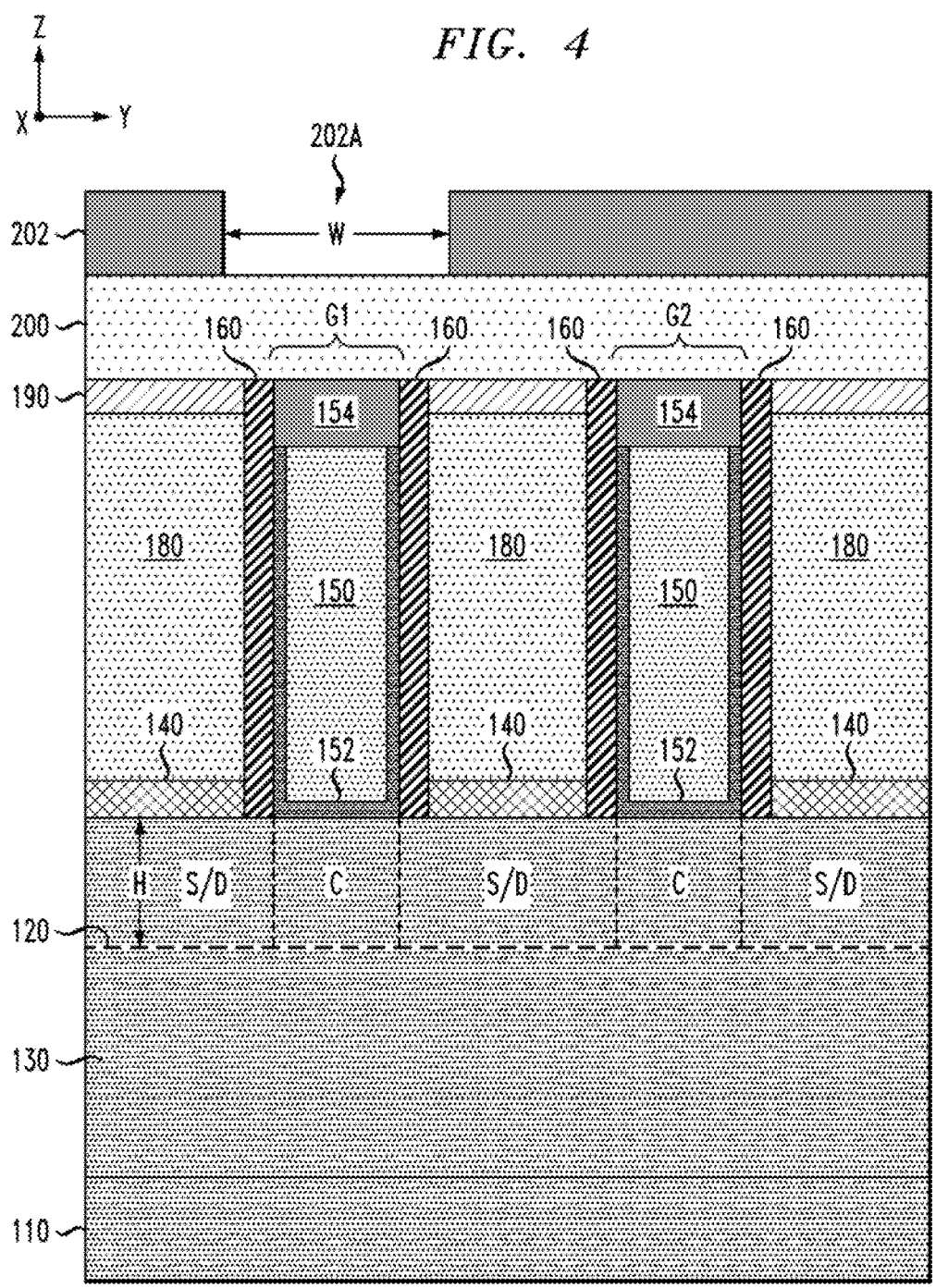

Next, FIG. 4 is a schematic view of the semiconductor device of FIG. 3 after forming a second ILD layer 200 over the planarized surface of the semiconductor device, and forming a gate contact etch mask 202 on the second ILD layer 200. The second ILD layer 200 can be formed of the same or similar materials as the first ILD layer 170 as noted above. The gate contact etch mask 202 comprises an opening 202A which defines an image of vertical gate contact to be subsequently formed in the second ILD layer 200. As shown in FIG. 4, the etch mask opening 202A has a width W that is wider than a width of the metal gate structure G1 and which overlaps portions of the vertical source/drain contacts 180 on both sides of the metal gate structure G1. The gate contact etch mask 202 can be a photoresist mask that is formed using standard photolithography techniques.

Figure 5:
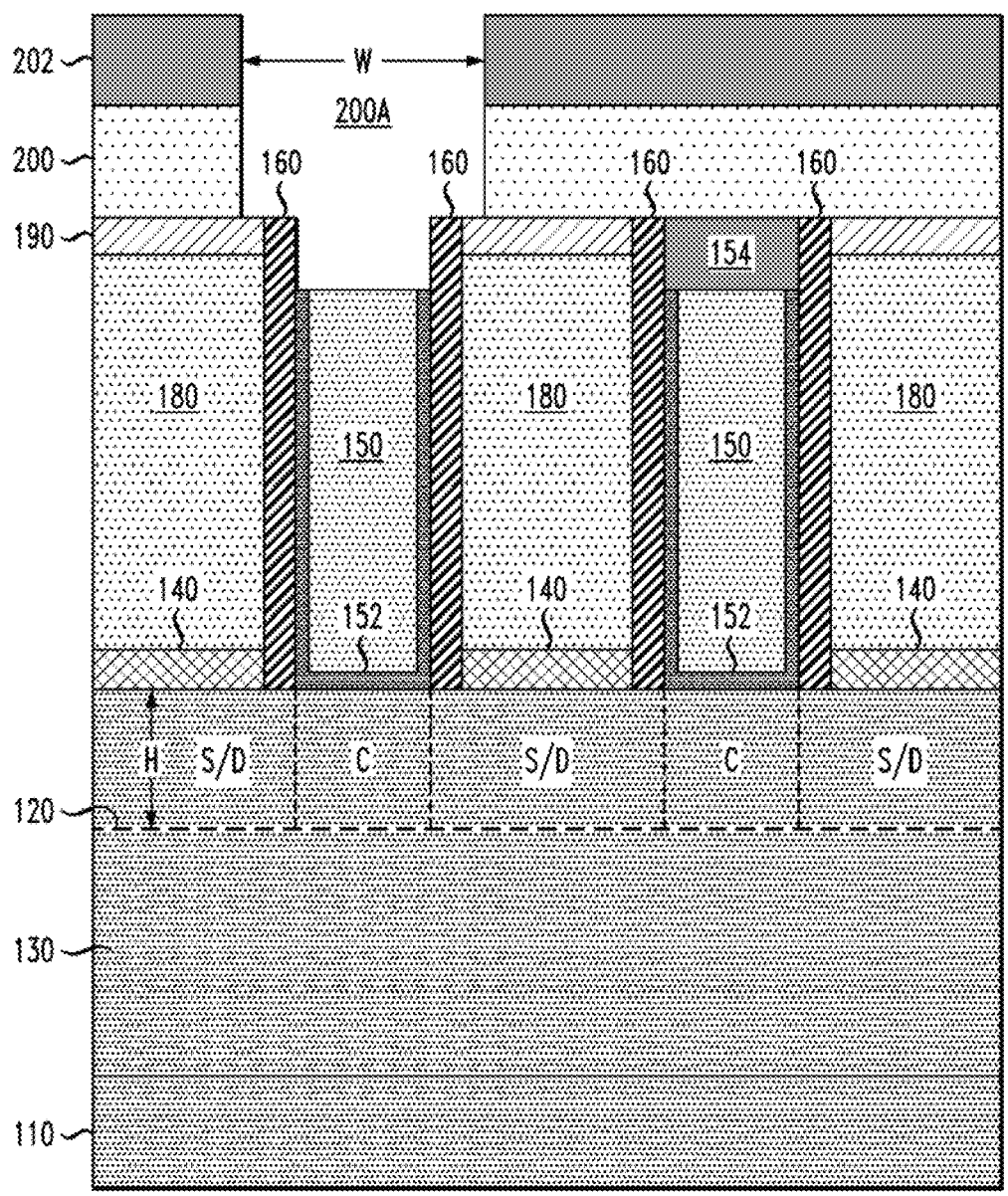

Next, FIG. 5 is a schematic view of the semiconductor device of FIG. 4 after patterning the second ILD layer 200 using the gate contact etch mask 202, and removing a portion of the gate capping layer 154 to expose the metal gate electrode layer 150 of the metal gate structure G1. The patterning process can be performed using one or more sequential etch processes to etch the materials of the second ILD layer 200 and the gate capping layer 154 selective to the materials of the source/drain contact capping layer 190, the gate sidewall spacer 160, and the gate electrode layer 150. The etch process results in the semiconductor structure shown in FIG. 5, wherein a gate contact opening 200A in the second ILD layer 200 exposes portions of the source/drain contact capping layer 190 and overlaps portions of the vertical source/drain contacts 180 on either side of the metal gate structure G1, thereby providing a self-aligned etch process to expose the underling gate electrode layer 150 due to the etch selectivity of the materials. Although only one gate contact opening 200A is shown in FIG. 5 for illustrative purposes, gate contact openings are formed in other regions of the second ILD layer 200 to expose portions of gate electrode layers of the metal gate structures (e.g., G2) of other FinFET devices (e.g., D2).

Figure 6:
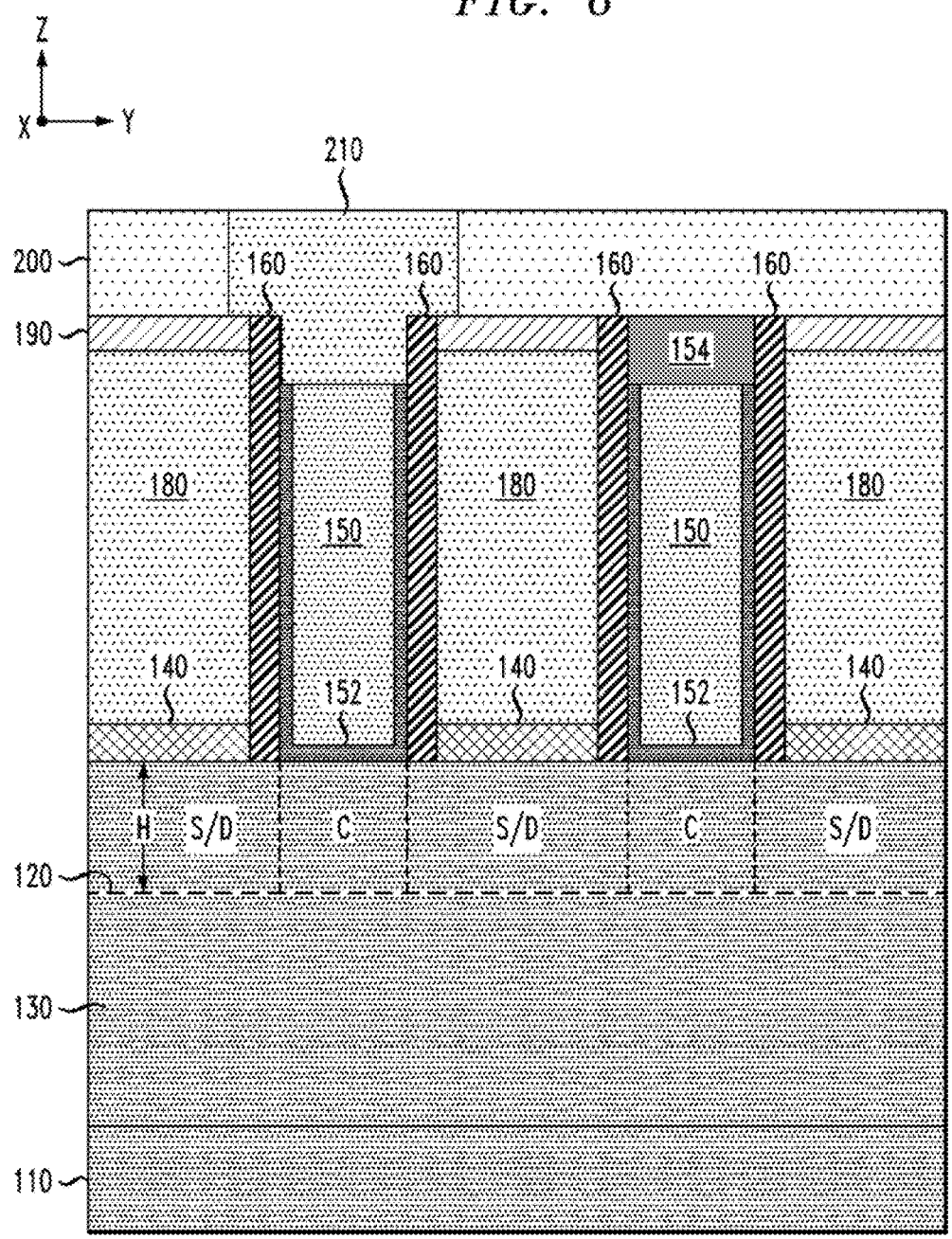

The process flow continues with removing the gate contact etch mask 202, and filling the gate contact openings with metallic material to form vertical gate contacts. For example, FIG. 6 is a schematic view of the semiconductor device of FIG. 5 after forming a vertical gate contact 210 in the gate contact opening 200A, which contacts the metal gate electrode layer 150 of the metal gate structure G1 of the first FinFET device D1. The vertical gate contact 210 can be formed by depositing a layer of metallic material to fill the gate contact opening 200A with metallic material such as tungsten, cobalt, aluminum, or other conductive materials that are suitable for use in forming vertical device contacts in a MOL layer of the semiconductor device. Depending on the conductive material used to form the vertical gate contact 210, a thin barrier diffusion layer may be deposited to line the contact opening 200A to insulate the metallic material from the second ILD layer 200. However, if the metallic material is formed of tungsten, for example, no liner layer may be needed as tungsten is not reactive with the dielectric materials that are typically used to form the second ILD layer 200. After depositing the layer of metallic material, a planarizing process (e.g., CMP) is performed to remove the overburden metallic material down to an upper surface of the second ILD layer 200, resulting in the semiconductor structure shown in FIG. 6.

Figure 7:
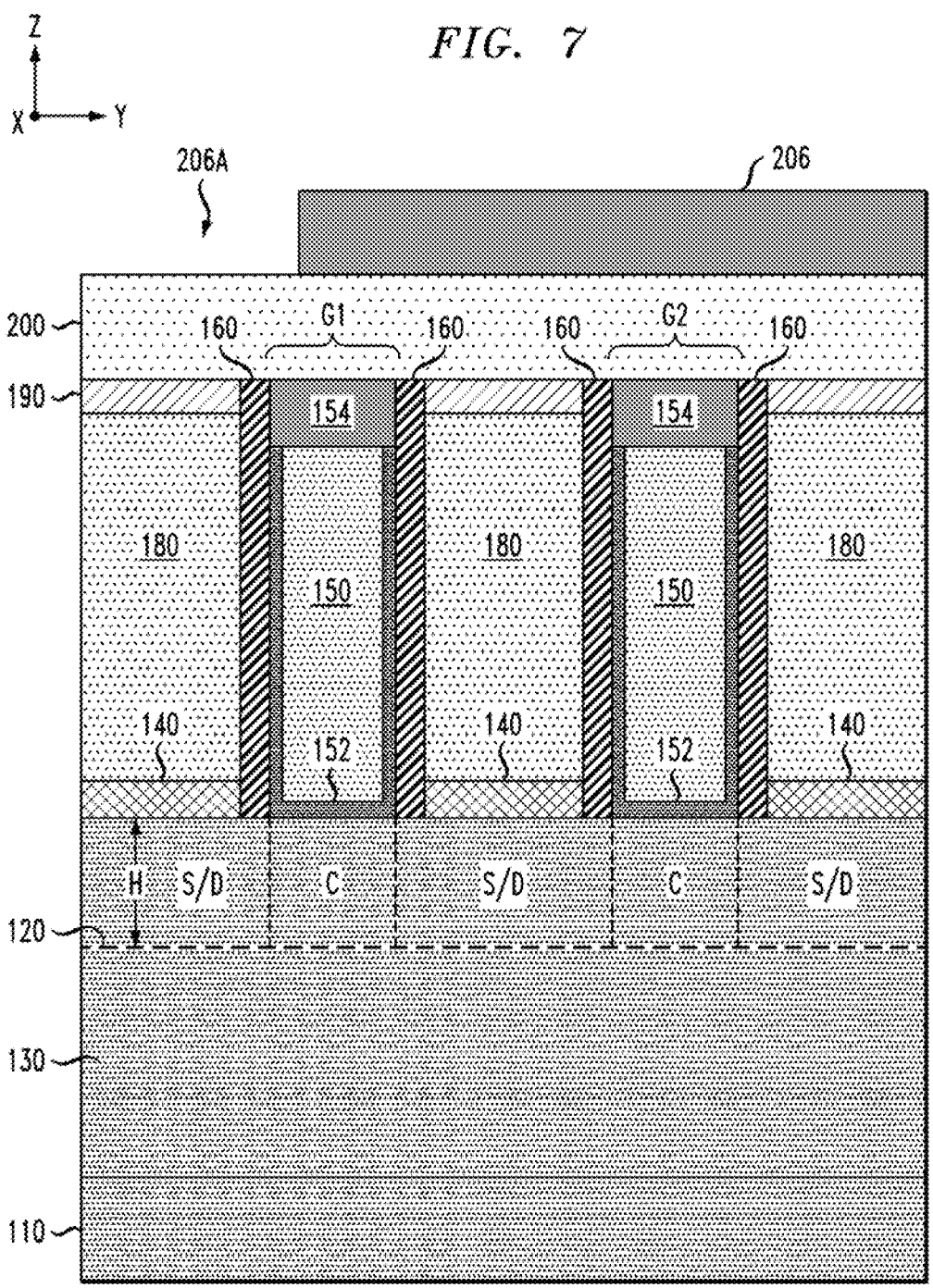
Figure 8:
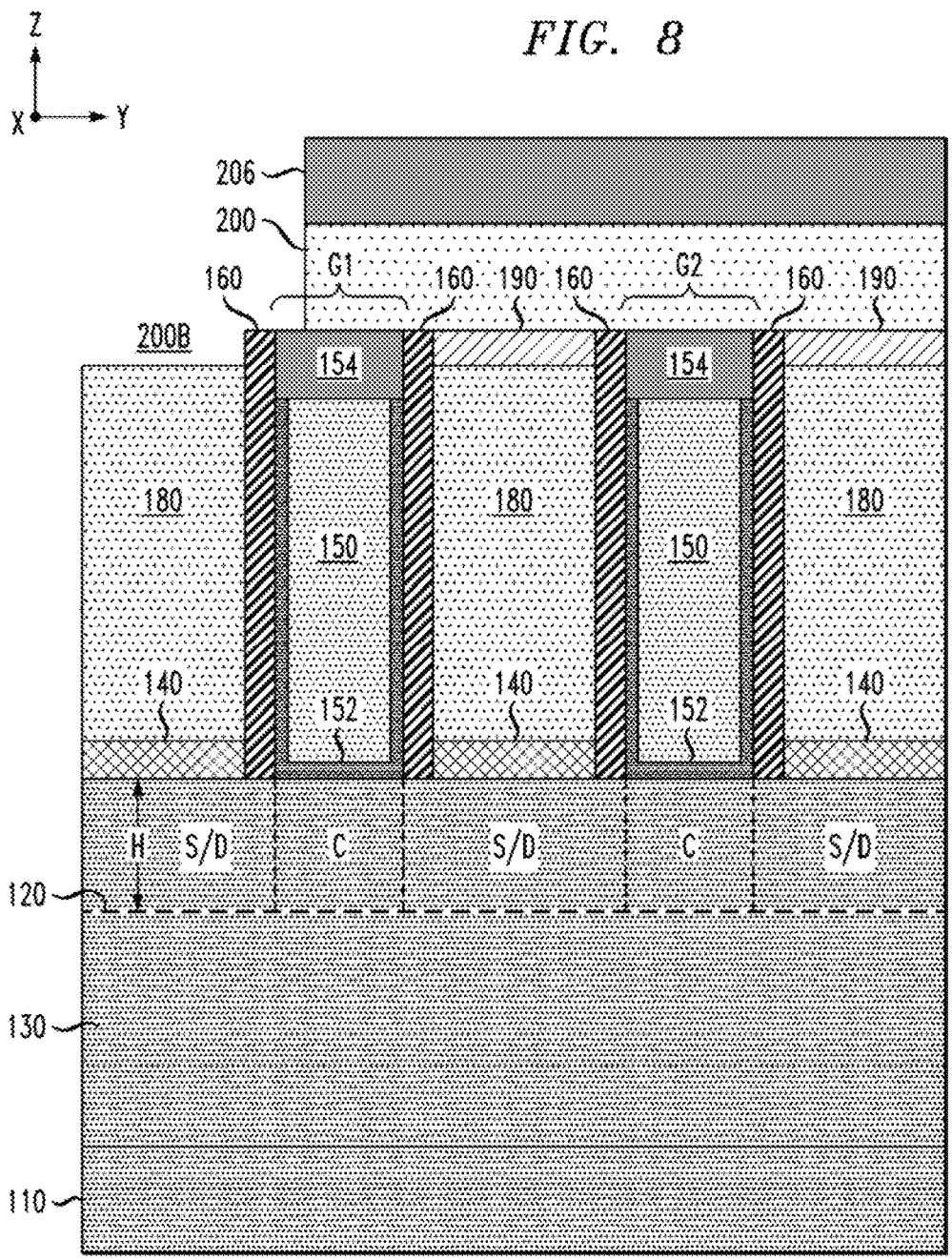
Figure 9:
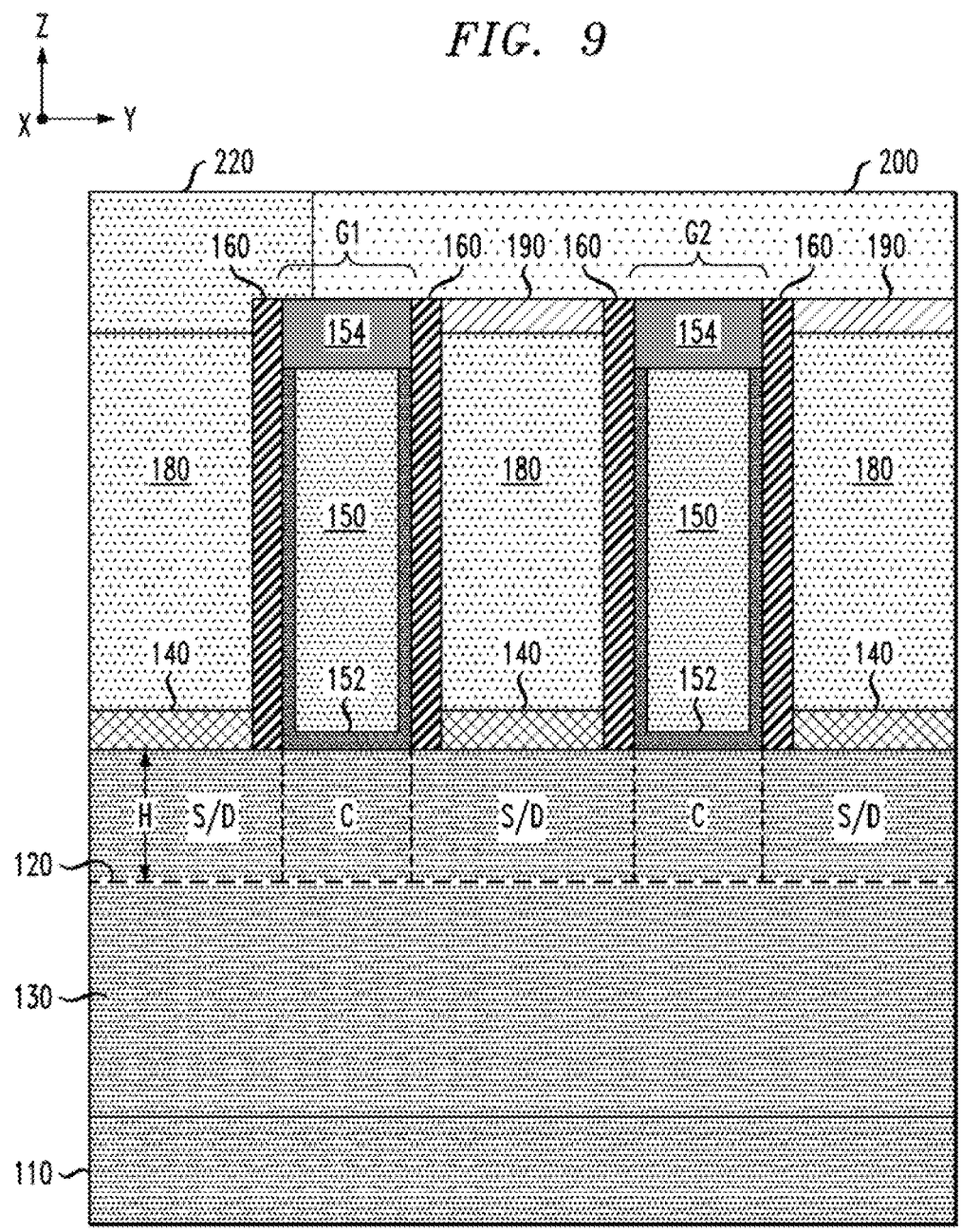

The fabrication process then continues with forming source/drain via contacts in the second ILD layer 200 in contact with the vertical source/drain contacts 180, using a process flow as schematically illustrated in FIGS. 7, 8 and 9. For example, FIG. 7 is a schematic view of the semiconductor device of FIG. 6 after forming a source/drain contact etch mask 206 on the second ILD layer 200. The source/drain contact etch mask 206 comprises an opening 206A which defines an image of a source/drain via contact to be subsequently formed in the second ILD layer 200 in contact with the vertical source/drain contact 180 on one side of the metal gate structure G1. As shown in FIG. 7, the etch mask opening 206A has a width that overlaps one vertical sidewall of the metal gate structure G1. The source/drain contact etch mask 206 can be a photoresist mask that is formed using standard photolithography techniques.

Next, FIG. 8 is a schematic view of the semiconductor device of FIG. 7 after patterning the second ILD layer 200 and the source/drain contact capping layer 190 using the source/drain contact etch mask 206 to expose a portion of an upper surface of the vertical source/drain contact 180 adjacent to the metal gate structure G1 of the first FinFET device D1. The patterning process can be performed using one or more sequential etch processes to etch the materials of the second ILD layer 200 and the source/drain contact capping layer 190 selective to the materials of the gate capping layer 154 and the gate sidewall spacer 160. The etch process results in the semiconductor structure shown in FIG. 8, wherein a source/drain via contact opening 200B formed in the second ILD layer 200 overlaps a vertical sidewall of the metal gate structure G1. This process provides a self-aligned etch process to expose the underlying vertical source/drain contact 180 while preventing or otherwise minimizing etch damage to the gate capping layer 154 and the gate sidewall spacer 160 due to the etch selectivity of the materials. Although only one source/drain via contact opening 200B is shown in FIG. 8 for illustrative purposes, it is to be understood that source/drain via contact openings are formed in other regions of the second ILD layer 200 to expose other vertical source/drain contacts of the FinFET devices.

The process flow continues with removing the source/drain contact etch mask 206, and filling the source/drain via contact openings with metallic material to form source/drain via contacts. For example, FIG. 9 is a schematic view of the semiconductor device of FIG. 8 after forming a metallic source/drain via contact 220 in the source/drain via contact opening 200B in contact with the vertical source/drain contact 180 on one side of the metal gate structure G1 of the first FinFET device D1. The source/drain via contact 220 can be formed by depositing a layer of metallic material to fill the source/drain via contact opening 200B with metallic material such as tungsten, cobalt, aluminum, or other conductive materials that are suitable for use in forming vertical device contacts in a MOL layer of the semiconductor device. Again, depending on the conductive material used to form the source/drain via contact 220, a thin barrier diffusion layer may be deposited to line the source/drain via contact opening 200B to insulate the metallic material from the second ILD layer 200. However, if the metallic material is formed of tungsten, for example, no liner layer may be needed as tungsten is not reactive with the dielectric materials that are typically used to form the second ILD layer 200. After depositing the layer of metallic material, a planarizing process (e.g., CMP) is performed to remove the overburden metallic material down to an upper surface of the second ILD layer 200, resulting in the semiconductor structure shown in FIG. 9.

Figure 10:
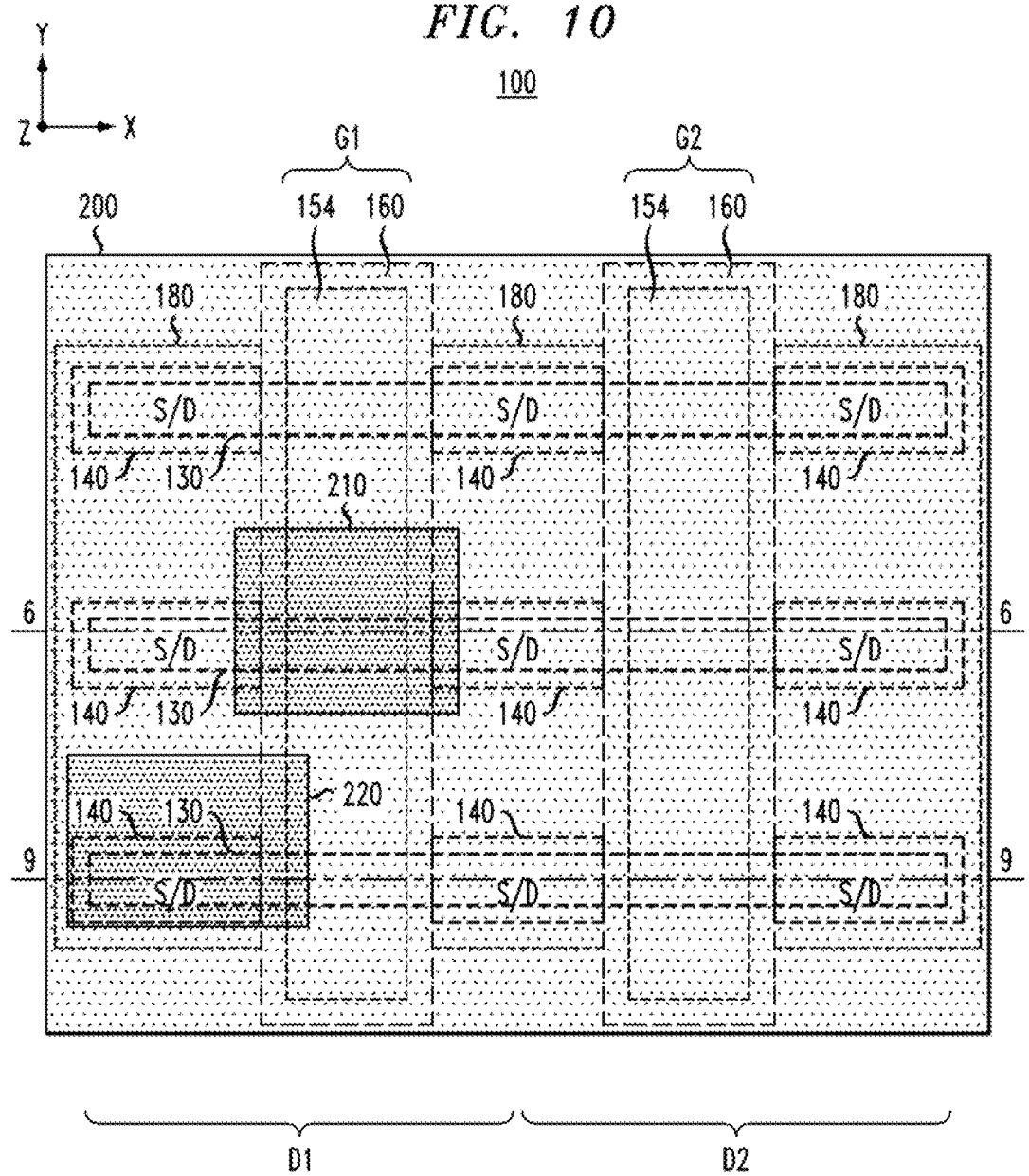

FIG. 10 is a top plan schematic view (X-Y plane) of the semiconductor device of FIG. 9 showing a layout of the gate and source/drain contacts, wherein the vertical gate contact 210 is formed in the active region overlapping portions of the vertical source/drain contacts 180 of the FinFET devices D1 and D2. For illustrative purposes, it is to be noted that FIG. 6 and FIG. 9 are cross-sectional schematic views along line 6-6 and line 9-9, respectively, shown in FIG. 10. As shown in FIGS. 6 and 10, while the gate contact 210 is formed to overlap portions of the vertical source/drain contacts 180 on either side of the metal gate structure G1, the vertical gate contact 210 is electrically insulated from the vertical source/drain contacts 180 by the source/drain contact capping layer 190. In addition, while the source/drain via contact 220 is formed to overlap the metal gate structure G1, the source/drain via contact 220 is electrically insulated from the gate electrode layer 150 by the gate capping layer 154 and the gate sidewall spacer 160.

Figure 11:
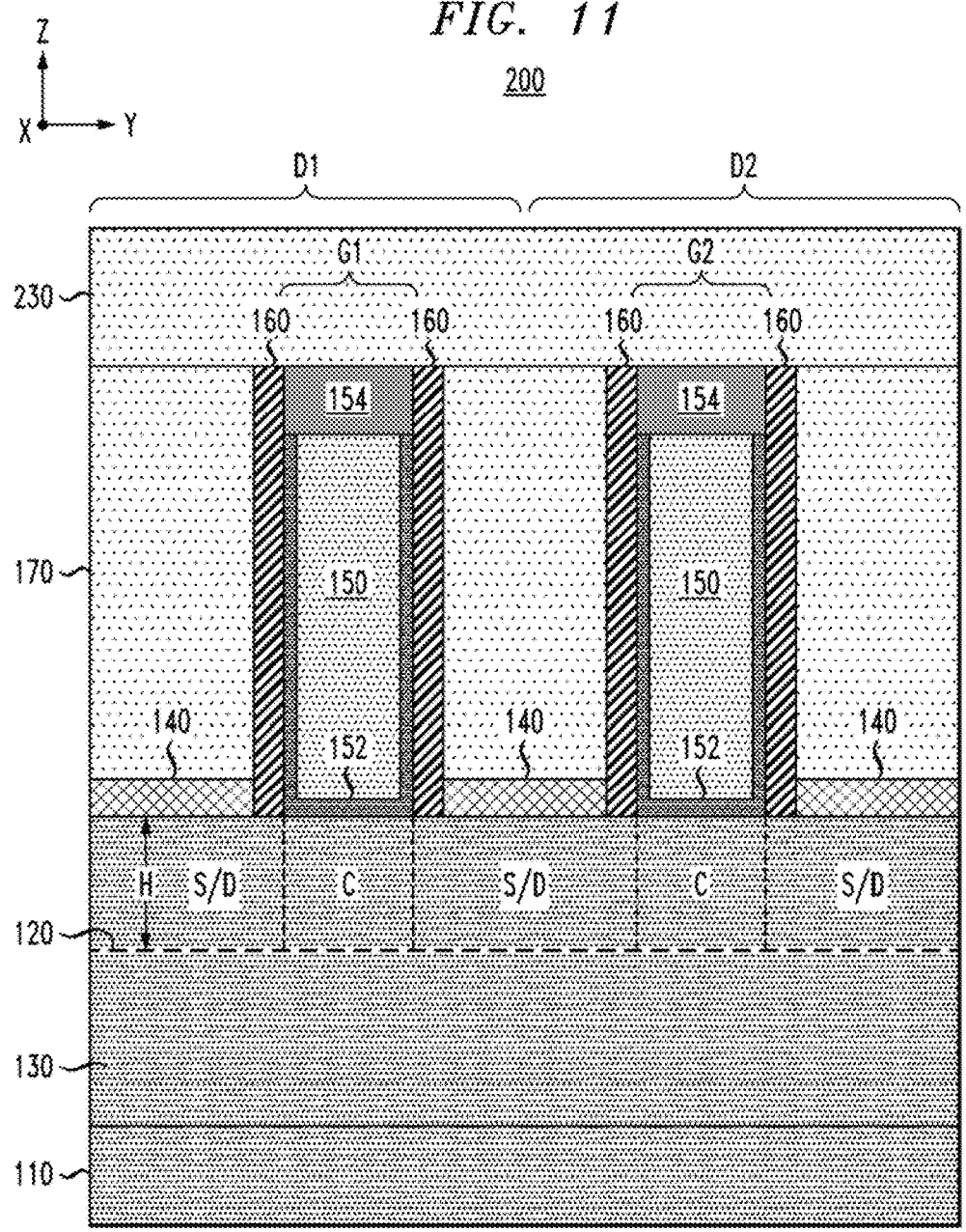

FIGS. 11 through 20 schematically illustrate a process for fabricating FinFET devices with gate contacts formed in active regions overlapping source/drain contacts, according to another embodiment of the invention. To begin, FIG. 11 is a schematic view of a semiconductor device 200 at an intermediate stage of fabrication in which FinFET devices D1 and D2 with respective metal gate structures G1 and G2 are formed on a semiconductor substrate. The semiconductor device 200 shown in FIG. 11 is the same as the semiconductor device 100 shown in FIGS. 1A, 1B, 1C, and 1D, except that the semiconductor device 200 comprises a second ILD layer 230 which is formed over the planarized substrate surface prior to formation of source/drain and gate contacts, wherein the contact formation process begins with the metal gate structures G1 and G1 fully encapsulated in an ILD layer that collectively comprises the first and second ILD layers 170 and 230. The semiconductor device 200 can be fabricated using the same or similar methods as discussed above with reference to FIGS. 1A, 1B, 1C, and 1D, but wherein the second ILD layer 230 is deposited on the planarized surface of the semiconductor device after forming the gate capping layers 154. In one embodiment, the second ILD layer 230 is formed of the same dielectric material as the first ILD layer 170.

Figure 12:
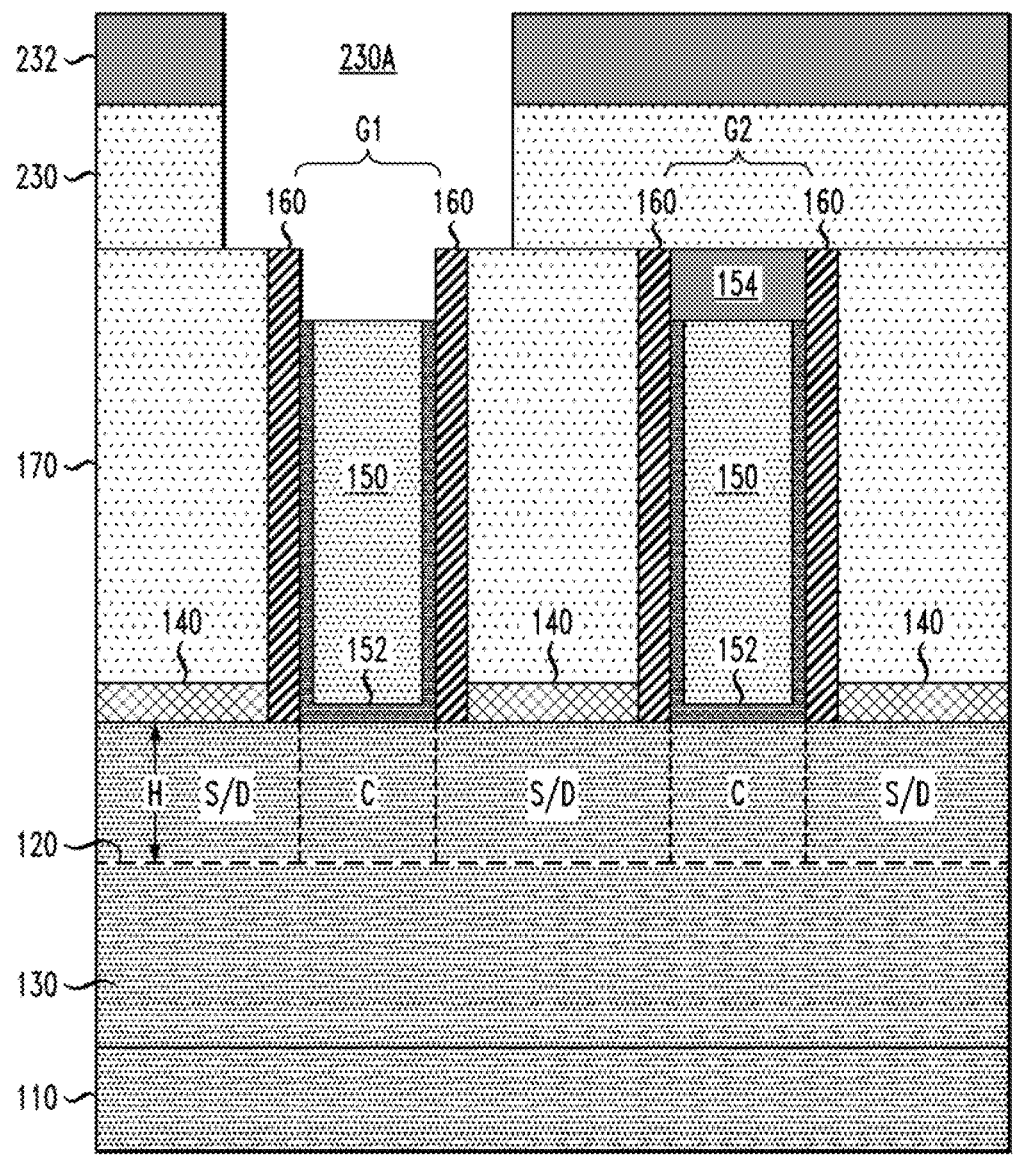

Next, FIG. 12 is a schematic view of the semiconductor device of FIG. 11 after forming a gate contact etch mask 232, patterning the second ILD layer 230 using the gate contact etch mask 232, and removing a portion of the gate capping layer 154 to expose a portion of the underlying metal gate electrode layer 150 of the metal gate structure G1. The patterning process can be performed using one or more sequential etch processes to etch the materials of the second ILD layer 230 and the gate capping layer 154 selective to the materials of the gate sidewall spacer 160, and the gate electrode layer 150. The etch process results in the formation of a gate contact opening 230A which is subsequently filled with metallic material to form a vertical gate contact. As shown in FIG. 12, the gate contact opening 230A overlaps a portion of the first ILD layer 170 on either side of the metal gate structure G1. Although only one gate contact opening 230A is shown in FIG. 12 for illustrative purposes, gate contact openings are formed in other regions of the second ILD layer 230 to expose the metal gate electrode layers of metal gate structures (e.g., G2) of other FinFET devices (e.g., D2).

Figure 13:
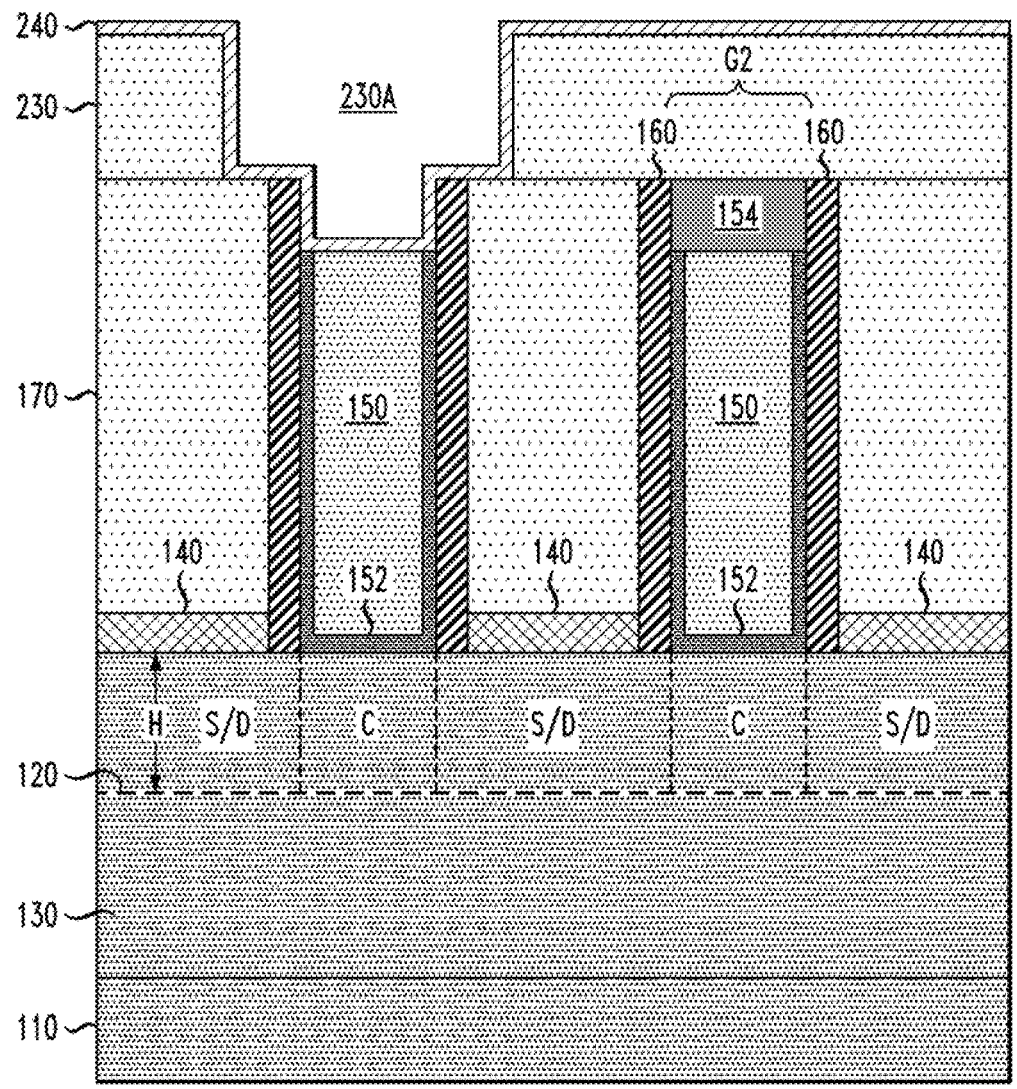

Next, FIG. 13 is a schematic view of the semiconductor device of FIG. 12 after removing the gate contact etch mask 232, and forming a conformal capping layer 240 over the surface of the substrate. The conformal capping layer 240 is formed by depositing a conformal layer of insulating material to a thickness in a range, for example, of about 5 nm to about 10 nm. The conformal capping layer 240 can be formed of SiCO, or some other suitable insulating material (e.g., low-k dielectric material) that can be etched selective to the materials of the gate sidewall spacers 160 and the gate capping layers 154.

Figure 14:
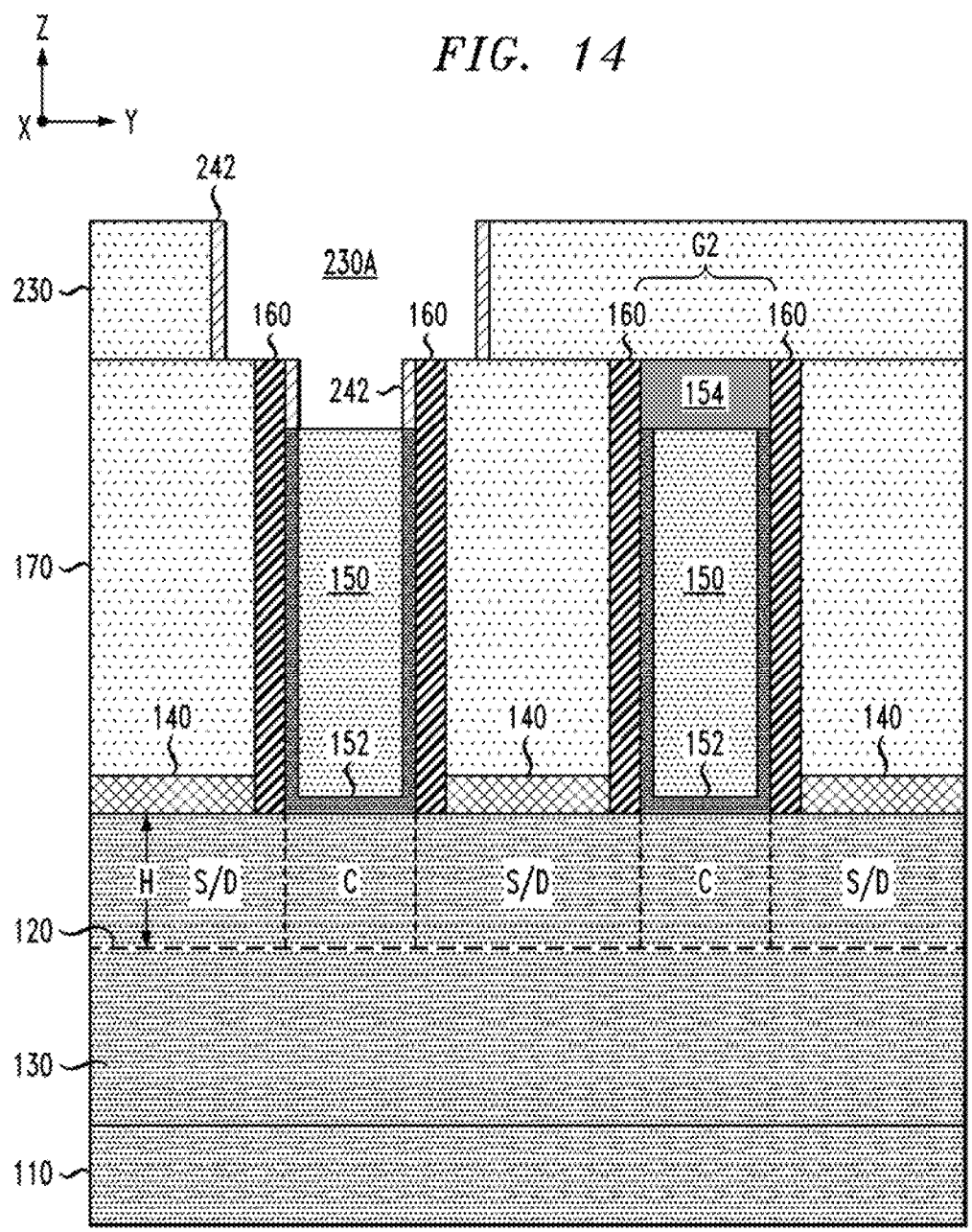

A directional etch back process (e.g., anisotropic dry etch process) is then performed to remove horizontal portions of the conformal capping layer 240 formed on horizontal surfaces of the substrate, resulting in the semiconductor structure shown in FIG. 14. In particular, FIG. 14 is a schematic view of the semiconductor device of FIG. 13 after patterning the conformal capping layer 240 to form insulating spacers 242 on vertical sidewalls of the gate contact opening 230A of the second ILD layer 230. As explained in further detail below, the insulating spacers 242 serve to insulate gate contacts from source/drain contacts.

Figure 15:
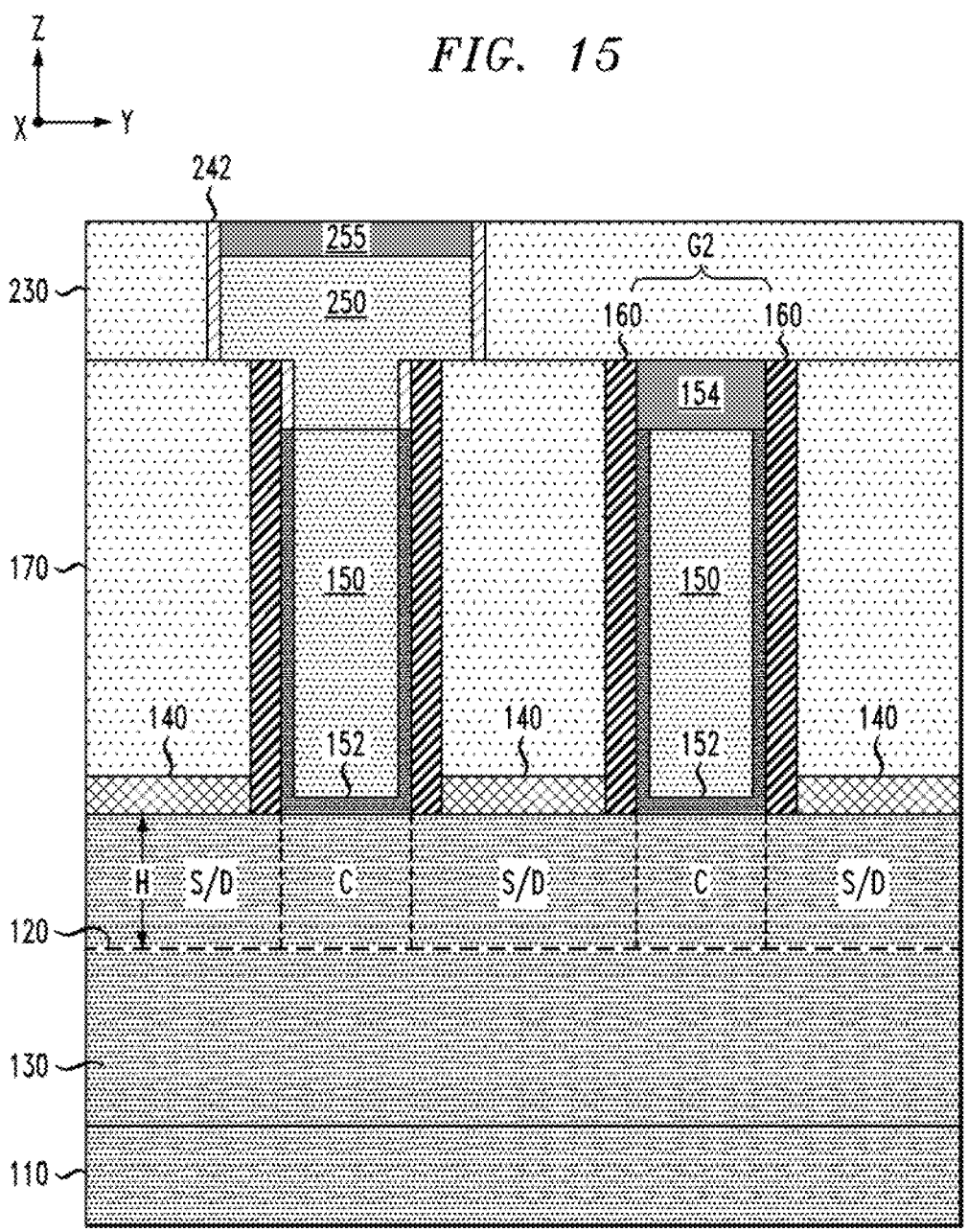

Next, FIG. 15 is a schematic view of the semiconductor device of FIG. 14 after forming a vertical gate contact 250 and a gate contact capping layer 255 in the gate contact opening 230A of the second ILD layer 230. As shown, the vertical gate contact 250 is formed in contact with an upper surface of the metal gate electrode layer 150 of the metal gate structure G1 of the first FinFET device D1, and the gate contact capping layer 255 is formed on an upper surface of the vertical gate contact 250. The vertical gate contact 250 can be formed by depositing a layer of metallic material to fill the gate contact opening 230A with metallic material (e.g., tungsten, other conductive materials as noted above which are suitable for use in forming vertical device contacts in a MOL layer of the semiconductor device), and then planarizing the substrate surface to remove the overburden metallic material down to an upper surface of the second ILD layer 230.

After forming the vertical gate contact 250, an etch process is performed to recess an upper surface of the vertical gate contact 250 down to a target depth which defines a thickness of the gate contact capping layer 255. Following recess of the vertical gate contact 250, the gate contact capping layer 255 is formed by depositing a layer of insulating material to fill the recessed region above the recessed surface of the vertical gate contact 250, and then planarizing the substrate surface to remove the overburden insulating material down to the upper surface of the second ILD layer 230, thereby forming the gate contact capping layer 255. In one embodiment, the gate contact capping layer 255 is formed of SiN. However, the gate contact capping layer 255 can be formed of other suitable insulating/dielectric materials which have etch selectivity with respect to the materials used to form the gate sidewall spacers 160, and source/drain capping layers (which are formed in a subsequent process flow discussed below with reference to FIG. 18).

Figure 16:
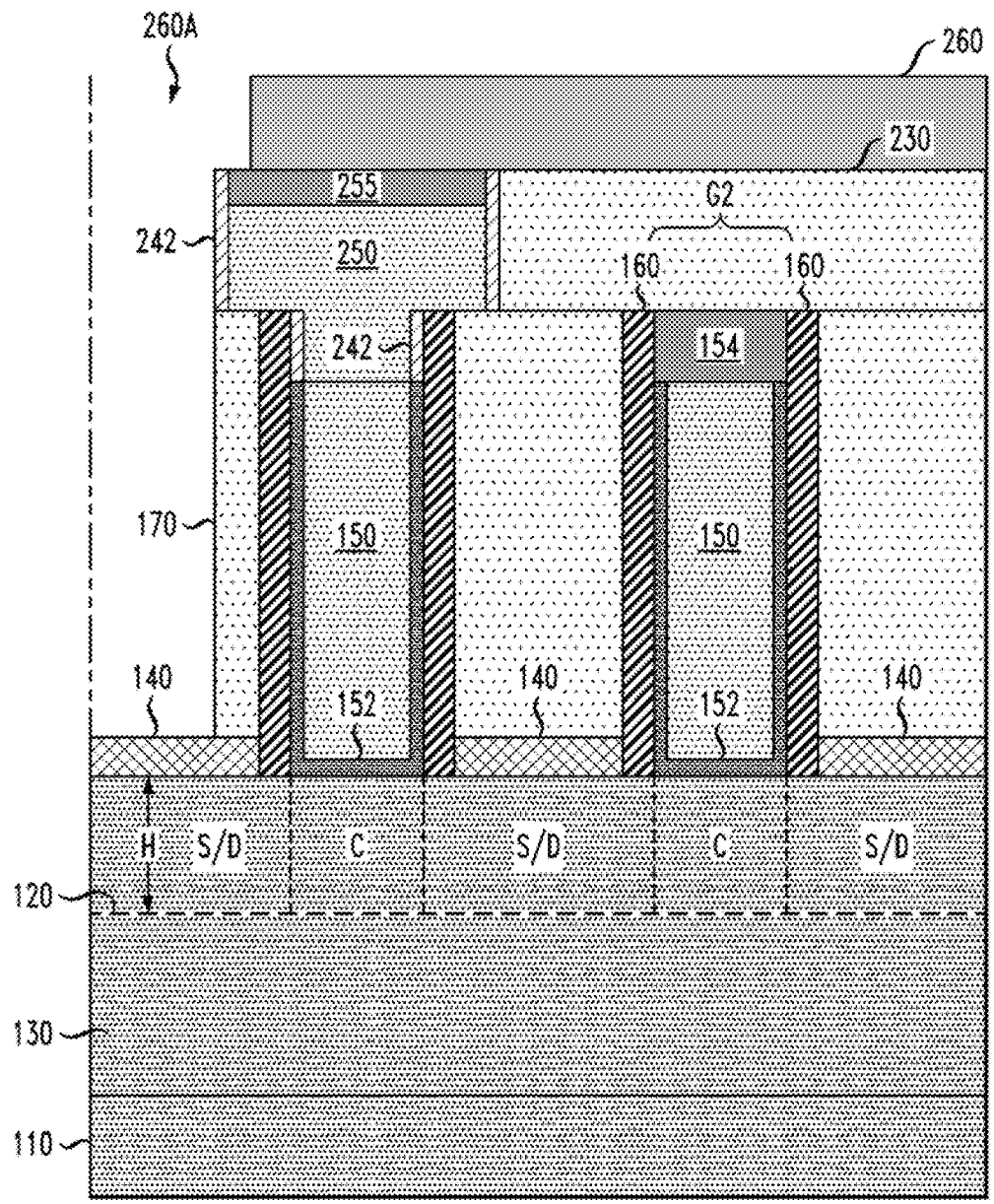
Figure 17:
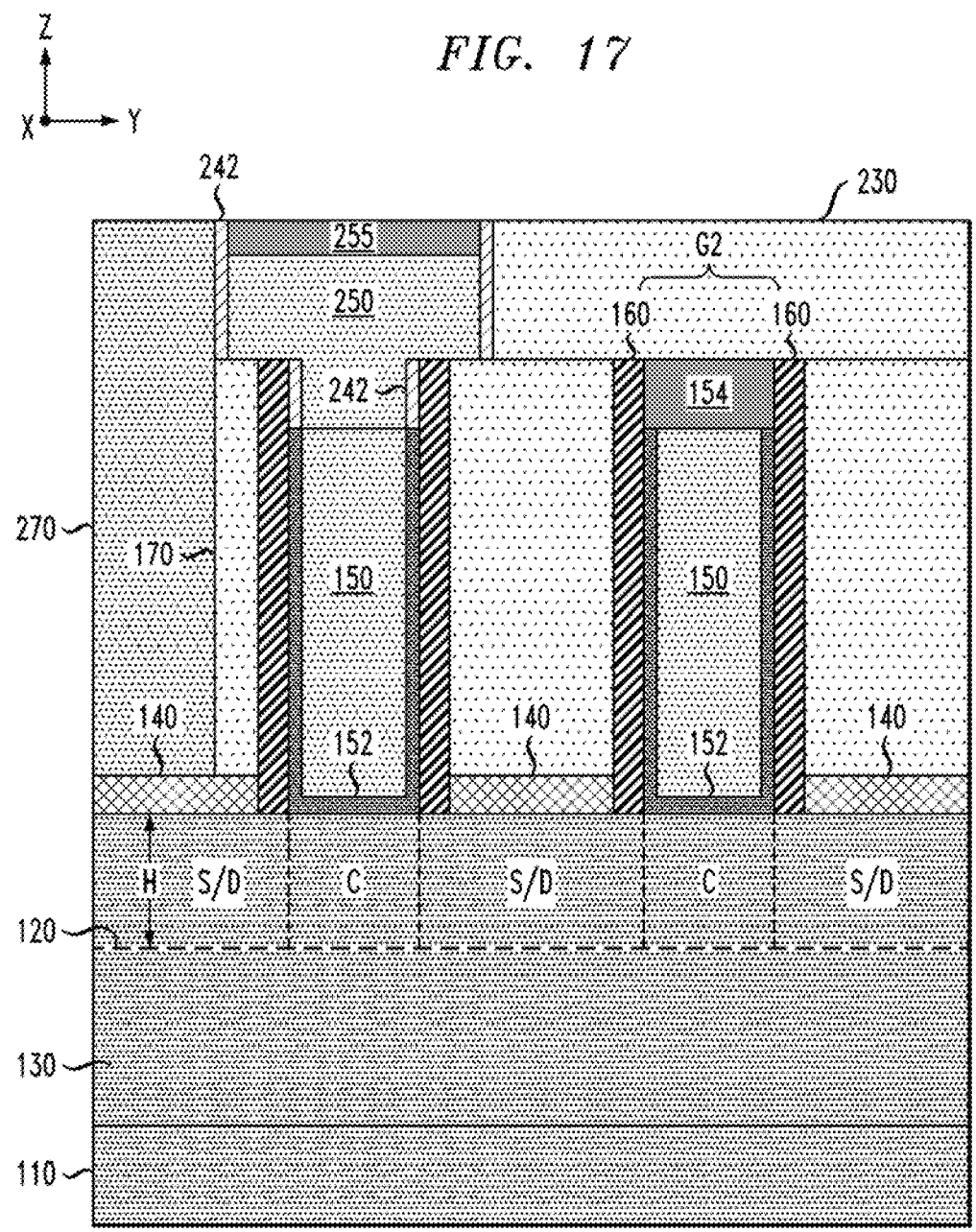

The fabrication process then continues with forming vertical source/drain contacts in the first and second ILD layers 170 and 230 in contact with underlying source/drain layers 140, using a process flow as schematically illustrated in FIGS. 16 and 17. For example, FIG. 16 is a schematic view of the semiconductor device of FIG. 15 after forming a source/drain contact etch mask 260 on the second ILD layer 230, and patterning the first and second ILD layers 170 and 230 using the source/drain contact mask 260 to form a vertical source/drain contact opening down to a source/drain layer 140 adjacent to the metal gate structure G1. As shown in FIG. 16, the source/drain contact etch mask 260 comprises an opening 260A that exposes a portion of the gate contact capping layer 255 and the insulating spacer 242, enabling a self-aligned process for the formation of a vertical source/drain contact. The source/drain contact etch mask 260 can be a photoresist mask that is formed using standard photolithography techniques.

The process flow continues with removing the source/drain contact etch mask 260, and filling the source/drain contact openings in the first and second ILD layers 170 and 230 with metallic material to form vertical source/drain contacts. For example, FIG. 17 is a schematic view of the semiconductor device of FIG. 16 after forming a vertical source/drain contact 270 in contact with the underlying source/drain layer 140 adjacent to the metal gate structure G1 of the first FinFET device D1. The vertical source/drain contact 270 can be formed by depositing a layer of metallic material to fill the source/drain contact opening with metallic material such as tungsten, cobalt, aluminum, or other conductive materials that are suitable for use in forming vertical device contacts in a MOL layer of the semiconductor device. Again, depending on the conductive material used to form the vertical source/drain via contact 270, a thin barrier diffusion layer may be deposited to line the source/drain contact opening to insulate the metallic material from contact with the portions of the ILD layers 170 and 230. However, if the metallic material is formed of tungsten, for example, no liner layer may be needed as tungsten is not reactive with the dielectric materials that are typically used to form the ILD layers 170 and 230. After depositing the layer of metallic material, a planarizing process (e.g., CMP) is performed to remove the overburden metallic material down to an upper surface of the second ILD layer 230, resulting in the semiconductor structure shown in FIG. 17.

Figure 18:
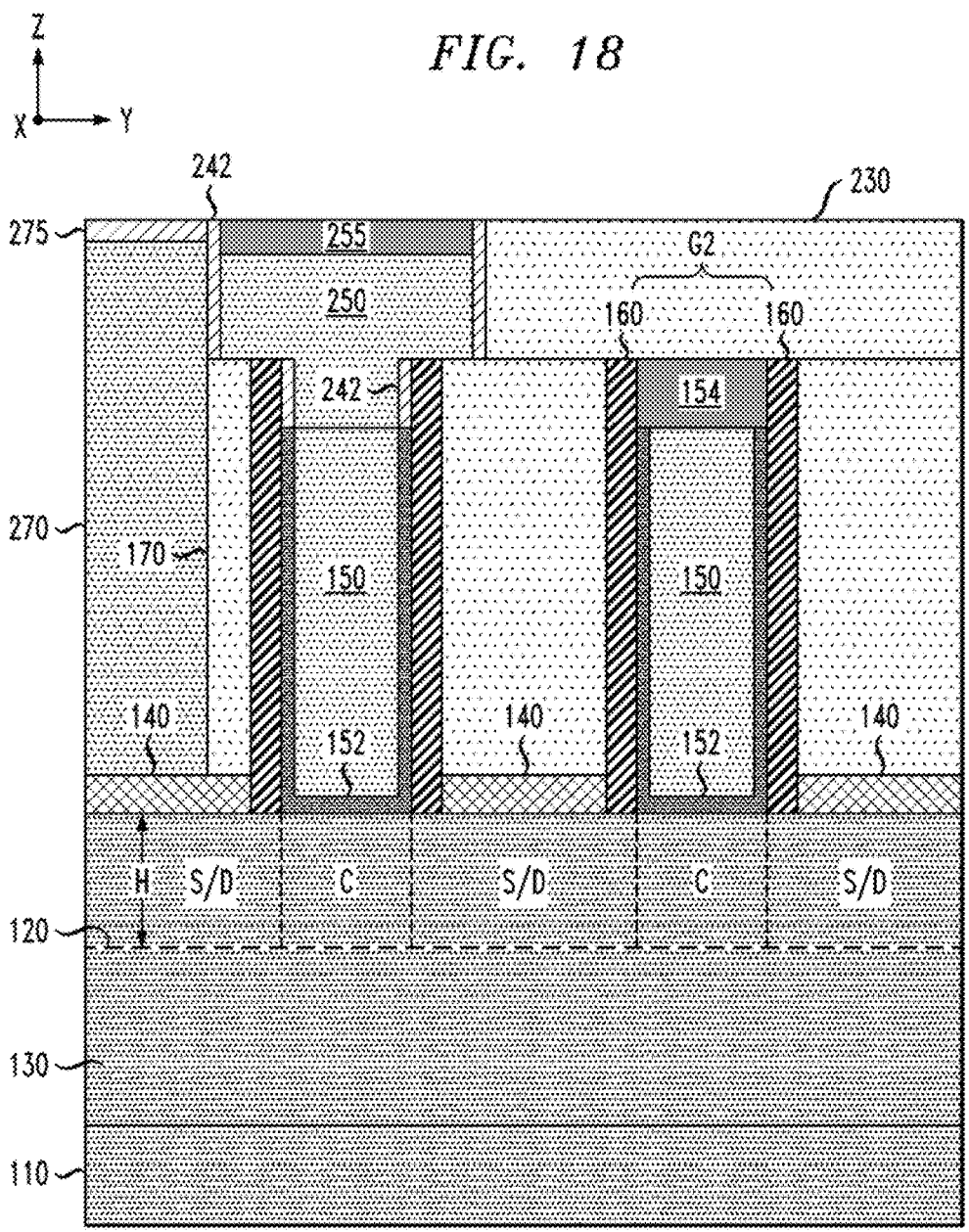

Next, FIG. 18 is a schematic view of the semiconductor device of FIG. 17 after recessing the vertical source/drain contact 270 and forming a source/drain contact capping layer 275 on the recessed surface of the vertical source/drain contact 270. For example, in one embodiment of the invention, the vertical source/drain contact 270 can be recessed down to a target level below the planarized surface of the semiconductor structure using an etch process and etch environment which is suitable to etch the metallic material (e.g., tungsten) of the vertical source/drain contact 270 selective to the dielectric materials of the second ILD layer 230, the gate contact capping layer 255, and the insulating spacers 242. Following the recess etch, a layer of insulating material is deposited to fill the recessed region above the recessed surface of the vertical source/drain contact 270, and then planarized to remove the overburden insulating material, resulting in the semiconductor structure shown in FIG. 18 with the source/drain contact capping layer 275 formed on the recessed surface of the vertical source/drain contact 270.

In one embodiment, the source/drain contact capping layer 275 is formed of an insulating/dielectric material that has etch selectivity with respect to the dielectric materials that form the gate contact capping layer 255, and the insulating spacer 242. For example, in one embodiment of the invention, the source/drain capping layer 275 is formed of SiCO, which can be etched selective to the dielectric materials (e.g., SiN, SiBCN) of the gate contact capping layer 255, and the insulating spacer 242.

Figure 19:
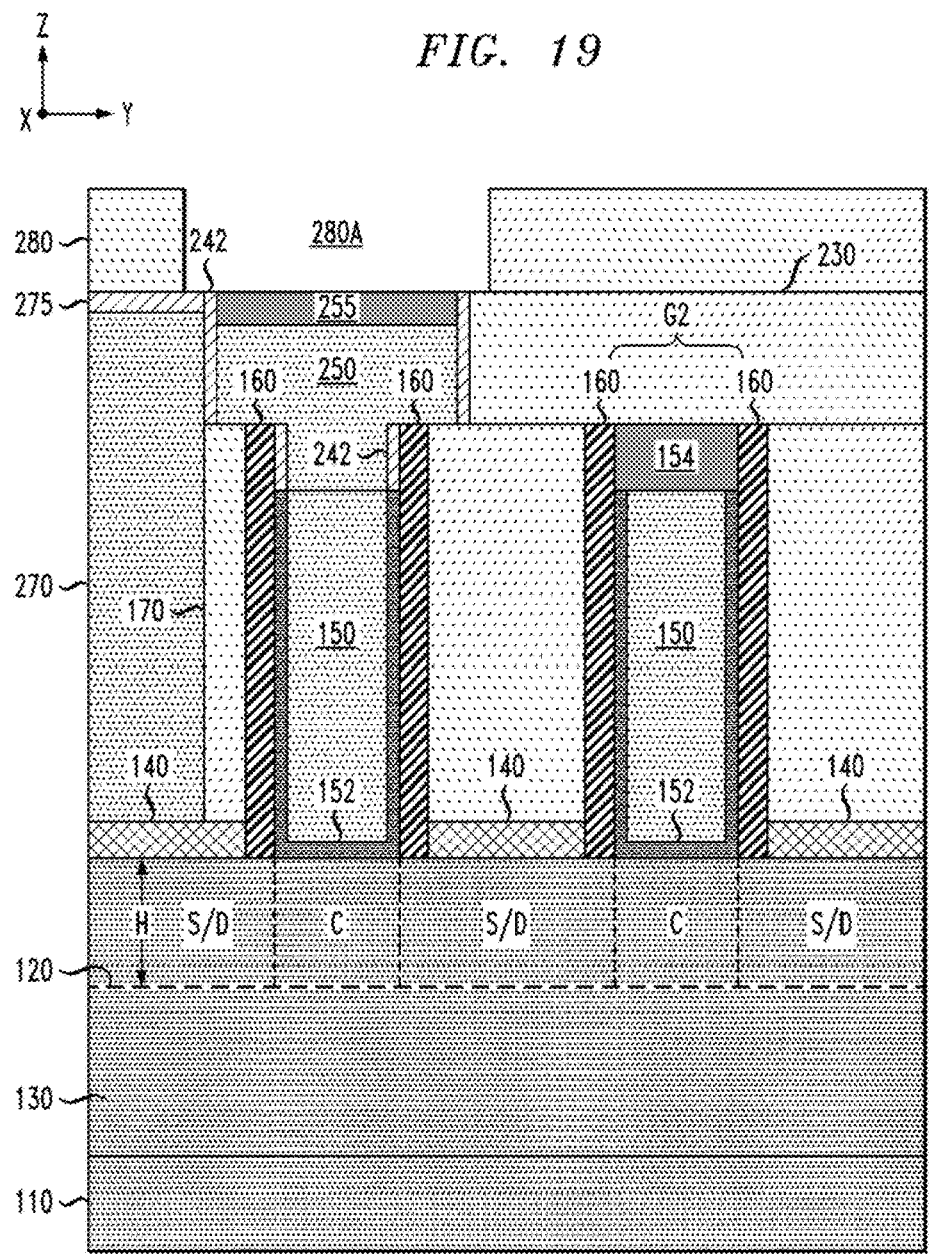

Next, FIG. 19 is a schematic view of the semiconductor device of FIG. 18 after depositing and patterning a third ILD layer 280 to form an opening 280A that exposes a portion of the gate contact capping layer 255 formed on the vertical gate contact 250. The third ILD layer 280 can be formed of the same or similar materials as the first and second ILD layers 170 and 230, and patterned using standard photolithography techniques. The opening 280A defines an image of a gate via contact that is to be subsequently formed in the third ILD layer 280. As shown in FIG. 19, the opening 280A has a width that is greater than a width of the vertical gate contact 250.

FIG. 20 is a schematic view of the semiconductor device of FIG. 19 after removing a portion of the gate contact capping layer 255 (which is exposed through the opening 260A) to expose a portion of the vertical gate contact 250, and forming a gate via contact 290 in contact with the vertical gate contact 250. The portion of the gate contact capping layer 255 which is exposed through the opening 280A can be etched using a wet or dry etch process which is selective to the materials of the ILD layers 230 and 280, the insulating spacers 242, and the source/drain contact capping layer 275. The gate via contact 290 is then formed by depositing a layer of metallic material (e.g., tungsten) to fill the opening 280A in the third ILD layer 280, and then planarizing the surface of the semiconductor substrate down to the third ILD layer 230 to remove the overburden metallic material, resulting in the semiconductor structure shown in FIG. 20.

As shown in FIG. 20, while the gate via contact 290 overlaps a portion of the vertical source/drain contact 270 in the active region of the semiconductor device, the source/drain capping layer 275 serves to electrically insulate the gate via contact 290 from the vertical source/drain contact 270. In addition, the insulating spacer 242 serves to electrically insulate the vertical gate contact 250 and the gate via contact 290 from the vertical source/drain contact 270. While only one source/drain contact and one gate contact are shown in FIG. 20 for illustrative purposes, it is to be understood that source/drain and gate contact structures are formed in other areas of the active device region concurrently with the formation of the vertical source/drain contact 270 and the gate contacts 250 and 290 in the respective stages of the fabrication process as discussed above.

Following the formation of the gate via contact 290, one or more source/drain via contacts can be formed in contact with the vertical source/drain contact 270 (and other vertical source/drain contacts) using a process flow that is the same or similar to the process flow discussed above with reference to FIGS. 6-9. Following formation of the MOL device contacts, a BEOL (back end of line) interconnect structure is formed using well known fabrication process flows to provide connections between the FinFET devices and other active or passive devices that are formed as part of the FEOL layer, the details of which are not needed to understand embodiments of the invention.

While exemplary methods are discussed herein in the context of FinFET devices, those of ordinary skill in the art can readily envision the implementation of the same or similar methods to form overlapping source/drain and gate contacts for planar FET devices having metal gate structures. Further, it is to be understood that the methods discussed herein for fabricating FinFET devices with gate contacts formed in active regions overlapping source/drain contacts can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a semiconductor device, comprising:

forming a field effect transistor (FET) device on a semiconductor substrate, the FET device comprising a source/drain layer, and a gate structure comprising a gate electrode layer, a gate capping layer, and a gate sidewall spacer;

forming a first interlevel dielectric (ILD) layer which encapsulates the FET device;

forming a gate contact opening in the first ILD layer and the gate capping layer to expose a portion of the gate electrode layer of the gate structure, wherein a portion of the gate contact opening has width that is greater than a width of the gate structure;

forming an insulating spacer on vertical sidewalls of the gate contact opening in the first ILD layer;

forming a vertical gate contact in the gate contact opening in contact with the exposed portion of the gate electrode layer of the gate structure of the FET device;

forming a source/drain contact opening in the first ILD layer down to the source/drain layer of the FET device, wherein the source/drain contact opening exposes a portion of the insulating spacer formed on the vertical sidewalls of the gate contact opening; and forming a vertical source/drain contact in the source/drain contact opening in contact with the source/drain layer, wherein the exposed portion of the insulating spacer serves to electrically insulate the vertical gate contact from the vertical source/drain contact.

2. The method of claim 1, further comprising:
forming a gate contact capping layer on an upper surface of the vertical gate contact prior to forming the vertical source/drain contact; and
forming a source/drain contact capping layer on an upper surface of the vertical source/drain contact;
wherein the source/drain contact capping layer is formed of an insulating material that has etch selectivity with respect to insulating materials that form the insulating spacer and the gate contact capping layer.

3. The method of claim 2, wherein the gate contact capping layer is formed of silicon nitride (SiN) and wherein the source/drain contact capping layer is formed of silicon oxycarbide (SiCO).

4. The method of claim 2, wherein forming the source/drain contact capping layer on the upper surface of the vertical source/drain contact comprises:
recessing a portion of the upper surface of the vertical source/drain contact;
depositing a conformal layer of insulating material to cover the recessed portion of the upper surface of the vertical source/drain contact; and
performing a planarization process to remove an overburden portion of the conformal layer of insulating material and form the source/drain contact capping layer;
wherein the planarization process results in upper surfaces of the source/drain contact capping layer and gate contact capping layer being coplanar.

5. The method of claim 2, further comprising:
forming a second ILD layer which comprises a gate via contact opening that exposes a portion of the gate contact capping layer, and a portion of the source/drain contact capping layer formed on the vertical source/drain contact;
etching the exposed portion of the gate contact capping layer selective to the exposed portion of the source/drain contact capping layer to expose a portion of the vertical gate contact; and
forming a gate via contact in the gate via contact opening of the second ILD layer in contact with the exposed portion of the vertical gate contact and the exposed portion of the source/drain contact capping layer;
wherein a portion of the gate via contact overlaps a portion of the vertical source/drain contact; and
wherein the source/drain contact capping layer electrically insulates the overlapping portions of the gate via contact and the vertical source/drain contact.

6. The method of claim 1, wherein the vertical source/drain contact and the vertical gate contact are formed of tungsten.

7. The method of claim 1, wherein forming the insulating spacer on the vertical sidewalls of the gate contact opening in the first ILD layer comprises:
depositing a conformal layer of insulating material; and
anisotropically etching the conformal layer of insulating material.

8. The method of claim 1, wherein the insulating spacer on the vertical sidewalls of the gate contact opening in the first ILD layer comprises silicon boron carbon nitride (SiBCN).

9. The method of claim 1, wherein the gate contact opening is formed of a width which extends past the gate sidewall spacer of the gate structure.

10. The method of claim 1, wherein the FET device comprises a FinFET device.

11. A semiconductor device, comprising:
a field effect transistor (FET) device disposed on a semiconductor substrate, wherein the FET device comprises a source/drain layer, and a gate structure comprising a gate electrode layer, a gate capping layer, and a gate sidewall spacer;
a vertical source/drain contact disposed in contact with the source/drain layer of the FET device;
a source/drain contact capping layer disposed on an upper surface of the vertical source/drain contact;
a vertical gate contact disposed in contact with a portion of the gate electrode layer of the gate structure of the FET device, which is exposed through an etched opening in the gate capping layer;
an insulating spacer disposed between overlapping sidewalls of the vertical gate contact and the vertical source/drain contact to thereby electrically insulate the vertical gate contact from the vertical source/drain contact;
a gate contact capping layer disposed on an upper surface of the vertical gate contact; and
a gate via contact disposed in contact with a portion of the vertical gate contact that is exposed through an etched opening in the gate contact capping layer, wherein a portion of the gate via contact overlaps a portion of the vertical source/drain contact;
wherein the source/drain contact capping layer electrically insulates the overlapping portions of the gate via contact and the vertical source/drain contact.

12. The semiconductor device of claim 11, wherein the gate contact capping layer and the source/drain contact capping layer are formed of insulating materials that have etch selectivity with respect to each other.

13. The semiconductor device of claim 12, wherein the gate contact capping layer is formed of silicon nitride (SiN) and wherein the source/drain contact capping layer is formed of silicon oxycarbide (SiCO).

14. The semiconductor device of claim 11, wherein an upper surface of the source/drain contact capping layer is coplanar with an upper surface of the gate contact capping layer.

15. The semiconductor device of claim 11, further comprising a source/drain via contact disposed in contact with a portion of the vertical source/drain contact that is exposed through an etched opening in the source/drain contact capping layer.

16. The semiconductor device of claim 11, wherein the insulating spacer comprises silicon boron carbon nitride (SiBCN).

17. The semiconductor device of claim 11, wherein the vertical source/drain contact and the vertical gate contact are formed of tungsten.

18. The semiconductor device of claim 11, wherein the FET device comprises a FinFET device.

19. The semiconductor device of claim 11, wherein the source/drain contact capping layer is formed of silicon oxycarbide (SiCO).

20. The semiconductor device of claim 11, wherein the gate contact capping layer is formed of a material that has etch selectivity with respect to materials that form the source/drain contact capping layer and the insulating spacer.

* * * * *